US 9,158,617 B2

(12) United States Patent
Cho et al.

(10) Patent No.: US 9,158,617 B2
(45) Date of Patent: Oct. 13, 2015

(54) METHOD OF PERFORMING WRITE OPERATION OR READ OPERATION IN MEMORY SYSTEM AND SYSTEM THEREOF

(71) Applicant: Samsung Electronics Co., Ltd, Suwon-si, Gyeonggi-do (KR)

(72) Inventors: Young-jin Cho, Seoul (KR); Eui-hyeok Kwon, Hwaseong-si (KR); Hak-sun Kim, Suwon-si (KR); Hyunsik Kim, Seoul (KR); Jae-geun Park, Seoul (KR); Seong-hoon Woo, Hwaseong-si (KR); Chul-seung Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 108 days.

(21) Appl. No.: 14/048,751

(22) Filed: Oct. 8, 2013

(65) Prior Publication Data
US 2014/0101514 A1   Apr. 10, 2014

(30) Foreign Application Priority Data

Oct. 8, 2012   (KR) ........................ 10-2012-0111381

(51) Int. Cl.
*H03M 13/00*   (2006.01)
*G06F 11/10*   (2006.01)
*H03M 13/09*   (2006.01)

(52) U.S. Cl.
CPC ............ *G06F 11/10* (2013.01); *G06F 11/1012* (2013.01); *G06F 11/1076* (2013.01); *H03M 13/09* (2013.01); *G06F 2211/109* (2013.01)

(58) Field of Classification Search
None
See application file for complete search history.

(56) References Cited

U.S. PATENT DOCUMENTS

| | | | |
|---|---|---|---|
| 5,159,336 A * | 10/1992 | Rabin et al. | 341/51 |
| 5,335,117 A | 8/1994 | Park et al. | |
| 5,459,850 A * | 10/1995 | Clay et al. | 711/171 |
| 5,951,710 A | 9/1999 | Kihara et al. | |
| 7,155,657 B2 | 12/2006 | Bordes et al. | |
| 7,225,297 B2 | 5/2007 | Heil | |
| 7,809,994 B2 | 10/2010 | Gorobets | |
| 8,341,501 B2 | 12/2012 | Franceschini et al. | |
| 8,788,894 B2 * | 7/2014 | Kang | 714/723 |
| 2004/0030847 A1 | 2/2004 | Tremaine | |
| 2004/0083334 A1 | 4/2004 | Chang et al. | |
| 2005/0078399 A1 | 4/2005 | Fung et al. | |
| 2007/0086279 A1 | 4/2007 | Wu et al. | |
| 2008/0141043 A1* | 6/2008 | Flynn et al. | 713/193 |
| 2008/0163028 A1* | 7/2008 | Mokhlesi | 714/763 |
| 2008/0282106 A1 | 11/2008 | Shalvi et al. | |
| 2009/0150744 A1* | 6/2009 | Flynn et al. | 714/752 |
| 2010/0088464 A1 | 4/2010 | Yang | |
| 2010/0180179 A1 | 7/2010 | Lastras-Montano | |

(Continued)

FOREIGN PATENT DOCUMENTS

| | | |
|---|---|---|
| JP | 2011-134433 | 7/2011 |
| KR | 10-0285109 | 11/1994 |

(Continued)

*Primary Examiner* — Daniel McMahon
(74) *Attorney, Agent, or Firm* — Ellsworth IP Group PLLC

(57) ABSTRACT

Performing a write operation or a read operation in a memory system may include compressing data of a first size unit, generating a plurality of types of Error Checking and Correction (ECC) information based on the compressed data, combining the compressed data and the plurality of types of ECC information in units of a second size, and writing the information combined in units of the second size into a memory device.

20 Claims, 23 Drawing Sheets

(56) References Cited

U.S. PATENT DOCUMENTS

| | | | |
|---|---|---|---|
| 2010/0281340 A1* | 11/2010 | Franceschini et al. | 714/763 |
| 2011/0154160 A1* | 6/2011 | Yurzola et al. | 714/763 |
| 2011/0161774 A1* | 6/2011 | Shin et al. | 714/755 |
| 2011/0292533 A1 | 12/2011 | Nitta et al. | |
| 2011/0320910 A1* | 12/2011 | Liu et al. | 714/758 |
| 2011/0320913 A1* | 12/2011 | Stracovsky et al. | 714/763 |
| 2011/0320915 A1* | 12/2011 | Khan | 714/773 |
| 2012/0005556 A1* | 1/2012 | Chang et al. | 714/758 |
| 2013/0042166 A1* | 2/2013 | Anand et al. | 714/785 |
| 2013/0254441 A1* | 9/2013 | Kipnis et al. | 710/68 |

FOREIGN PATENT DOCUMENTS

| | | |
|---|---|---|
| KR | 10-0554987 | 10/1998 |
| KR | 2003-0074386 | 9/2003 |
| KR | 2010-0119492 | 11/2010 |

* cited by examiner

METHOD OF PERFORMING WRITE OPERATION OR READ OPERATION IN MEMORY SYSTEM AND SYSTEM THEREOF

CROSS-REFERENCE TO RELATED APPLICATIONS

This application claims priority under 35 U.S.C. §119(a) from Korean Patent Application No. 10-2012-0111381, filed on Oct. 8, 2012, in the Korean Intellectual Property Office, the disclosure of which is incorporated herein in its entirety by reference.

BACKGROUND

1. Field

The present general inventive concept relates to a memory system and a method of controlling the memory system, and more particularly, to a method of performing a write operation or a read operation in a memory system.

2. Description of the Related Art

Memory devices are used to store data and are classified into volatile memory devices and nonvolatile memory devices. Characteristics of such a memory device may vary according to a usage environment, a usage count, or an elapse of a usage time. Thus, a technique of improving the error correction performance even while using the same error checking and correction (ECC) algorithm in memory systems including a memory device is required.

SUMMARY

The present general inventive concept provides a method of performing a write operation in a memory system to improve an error correction capability.

The present general inventive concept also provides a method of performing a read operation in a memory system to improve an error correction capability.

Additional features and utilities of the present general inventive concept will be set forth in part in the description which follows and, in part, will be obvious from the description, or may be learned by practice of the general inventive concept.

The foregoing and/or other features and utilities of the present general inventive concept are achieved by providing a method of performing a write operation in a memory system, including compressing data of a first size unit, generating a plurality of types of error checking and correction (ECC) information based on the compressed data, combining the compressed data and the plurality of types of ECC information in units of a second size, and writing the information combined in units of the second size into a memory device.

The first size unit may be determined as an ECC encoding processing size unit in the memory system.

The generating of the plurality of types of ECC information may include: dividing the compressed data into a plurality of pieces of divided compressed data, generating first parity information by firstly performing ECC encoding processing of a portion of the plurality of pieces of divided compressed data, and generating second parity information by secondly performing ECC encoding processing of information, which includes the portion of the plurality of pieces of divided compressed data for which the first parity information has been generated, the first parity information, and another portion of the plurality of pieces of divided compressed data for which the first parity information has not been generated.

The generating of the first parity information may include generating first information of the first size unit by adding initially set padding information to the portion of the plurality of pieces of divided compressed data, and generating the first parity information by performing ECC encoding processing of the first information.

The generating of the second parity information may include generating second information of the first size unit by adding initially set padding information to the information, which includes the portion of the plurality of pieces of divided compressed data for which the first parity information has been generated, the first parity information, and another portion of the plurality of pieces of divided compressed data for which the first parity information has not been generated, and generating the second parity information by performing ECC encoding processing of the second information.

The generating of the plurality of types of ECC information may include generating third information of the first size unit by adding initially set padding information to the compressed data, generating third parity information by performing ECC encoding processing of the third information, and generating RAID parity information for a plurality of pieces of information of the first size unit for which the third parity information has been generated, wherein the RAID parity information is generated to be able to restore one piece of information of the first size unit for which error correction is impossible from among the plurality of pieces of information of the first size unit.

The combining the compressed data and the plurality of types of ECC information in units of the second size may include generating information of the second size unit by combining the compressed data and the plurality of types of ECC information and adding initially set padding information to the combined information.

The method may further include generating metadata including attribute information for the information combined in units of the second size, wherein the attribute information includes the information used to generate the plurality of types of ECC information or padding size information used to generate the information of the first or second size unit.

The foregoing and/or other features and utilities of the present general inventive concept may also be achieved by providing a method of performing a read operation in a memory system, including: receiving data read from a memory device based on a data reading request; performing at least one time of error checking and correction (ECC) processing of compressed data included in the read data based on a plurality of types of ECC information included in the read data, and decompressing the compressed data for which the ECC processing has been performed.

The performing of the ECC processing may include performing first ECC processing of the compressed data included in the read data based on a first type of ECC information from among the plurality of types of ECC information included in the read data, and performing second ECC processing of the compressed data included in the read data based on a second type of ECC information from among the plurality of types of ECC information if error correction has failed in the result of the first ECC processing.

The performing of the first ECC processing may include extracting second parity information from the read data, generating second information of a first size, which includes compressed data of a portion of the read data for which first parity information has been generated, the first parity information, and compressed data of another portion of the read data for which the first parity information has not been generated, and performing the ECC processing of the second information based on the second parity information.

The performing of the second ECC processing may include: extracting first parity information from the read data if the error correction has failed in the result of the first ECC processing, generating first information in a first size by adding initially set padding information to compressed data of a portion of the read data for which first parity information has been generated, and performing ECC processing of the first information based on the first parity information.

The method may further include generating other second information of the first size unit, which includes compressed data of a portion of the read data for which the second ECC processing has been performed, the first parity information, and the compressed data of the portion of the read data for which first parity information has been generated, and performing ECC processing of the other second information based on the second parity information extracted from the read data.

The performing of the first ECC processing may include extracting third parity information from the read data, generating third information in the first size by extracting compressed data for which the third parity information has been generated and adding initially set padding information to the compressed data, and performing ECC processing of the third information based on the third parity information.

The performing of the second ECC processing may include restoring the compressed data for which error correction has failed in the result of the second ECC processing, by using RAID parity information included in the read data.

The foregoing and/or other features and utilities of the present general inventive concept may also be achieved by providing a memory system to receive data from a host, including a memory controller, including a compression processing unit to compress the data received from the host and output data of a first size unit, an error checking and correction (ECC) processing unit to generate ECC information based on the compressed data, a central processing unit (CPU) to combine the compressed data and the ECC information in units of a second size, and a memory device to receive the combined information in the second size unit from the CPU.

The data received from the host may include at least one of an application program file, user data, and metadata.

The memory controller may further include a decompression processing unit to receive compressed data from the memory device and to decompress the compressed data.

The memory controller may further include a memory interface to exchange a command, an address, and data with the memory device under the control of the CPU.

The memory controller may further include a host interface to exchange data with the host connected to the memory system and to mutually connect the memory system and the host.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Exemplary embodiments of the inventive concept will now be described in detail with reference to the accompanying drawings. The embodiments are provided to describe the inventive concept more fully to one of ordinary skill in the art. The inventive concept may allow various kinds of changes or modifications and various forms, and specific embodiments will be illustrated in drawings and described in detail in the specification. However, it should be understood that the specific embodiments do not limit the inventive concept to a specific disclosure form but include every modified, equivalent, or replaced one within the spirit and technical scope of the inventive concept. Like reference numbers are used to refer to like elements through the drawings and descriptions thereof. In the accompanying drawings, the dimension of structures are magnified or reduced than their actual ones for clarity of the inventive concept.

The terminology used in the application is used only to describe specific embodiments and does not have any intention to limit the inventive concept. An expression in the singular includes an expression in the plural unless they are clearly different from each other in a context. In the application, it should be understood that terms, such as 'include' and 'have', are used to indicate the existence of implemented feature, number, step, operation, element, part, or a combination of them without excluding in advance the possibility of existence or addition of one or more other features, numbers, steps, operations, elements, parts, or combinations of them.

All terms used herein including technical or scientific terms have the same meaning as those generally understood by one of ordinary skill in the art unless they are defined otherwise. It should be understood that terms generally used, which are defined in a dictionary, have the same meaning as in a context of related technology, and the terms are not understood as ideal or excessively formal meaning unless they are clearly defined in the application.

As used herein, the term "and/or" includes any and all combinations of one or more of the associated listed items.

Figure 1:
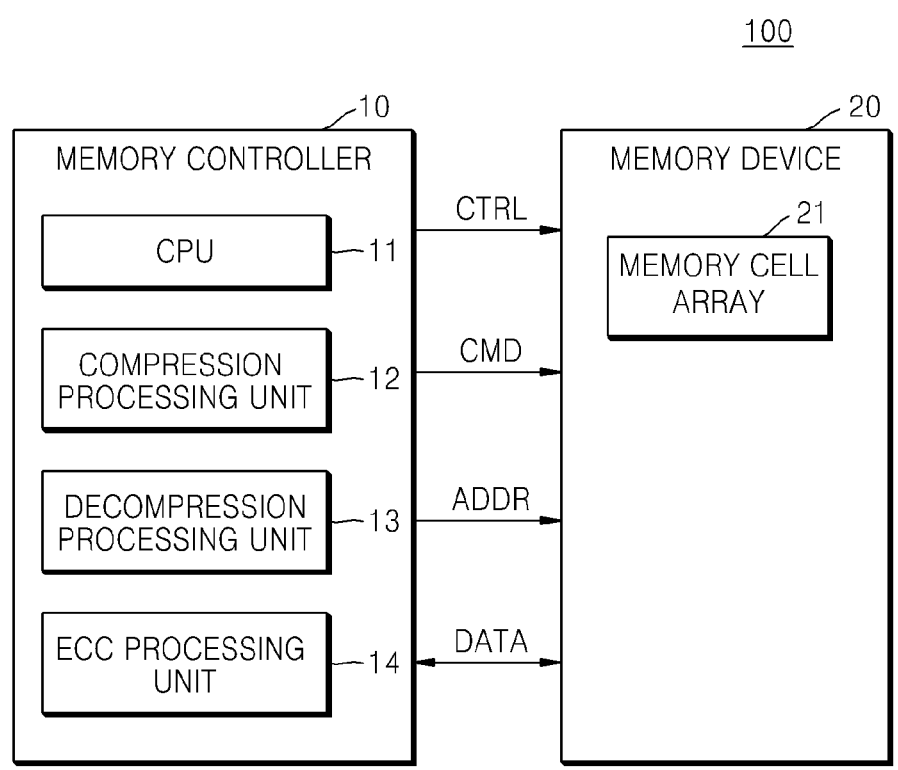
FIG. 1 is a block diagram of a memory system according to an exemplary embodiment of the present general inventive concept.

FIG. 1 is a block diagram of a memory system 100 according to an exemplary embodiment of the present general inventive concept.

Referring to FIG. 1, the memory system 100 may include a memory controller 10 and a memory device 20. The memory controller 10 may perform an operation of controlling the memory device 20, and in detail, the memory controller 10 may control program write, read, and erase operations of the memory device 20 by providing an address ADDR, a command CMD, and a control signal CTRL to the memory device 20. Components included in the memory controller 10 and the memory device 20 will now be described in detail.

The memory device 20 may include a memory cell array 21, which may include a plurality of memory cells arranged in regions where a plurality of word lines and a plurality of bit lines cross each other. According to an exemplary embodiment of the present general inventive concept, the plurality of memory cells may be flash memory cells, and the memory cell array 21 may be a NAND flash memory cell array or a NOR flash memory cell array. Hereinafter, exemplary embodiments of the present general inventive concept will be described by assuming that the plurality of memory cells are flash memory cells as an example. However, the present general inventive concept is not limited thereto, and according to another exemplary embodiment of the present general inventive concept, the plurality of memory cells may be resistive memory cells, such as resistive random access memory (RRAM), phase change RAM (PRAM), or magnetic RAM (MRAM).

The memory controller 10 may include a central processing unit (CPU) 11, a compression processing unit 12, a decompression processing unit 13, and an error checking and correction (ECC) processing unit 14.

The CPU 11 controls a general operation of the memory system 100. For example, the CPU 11 controls the memory system 100 to interpret a command received from a host and perform an operation according to an interpreted result. In detail, the CPU 11 may control the memory system 100 to perform a method of performing a write operation or a read operation in a memory system according to exemplary embodiments of the present general inventive concept illustrated in FIGS. 8 through 20.

The compression processing unit 12 compresses data to be stored in the memory device 20 under the control of the CPU 11. The data to be compressed may be various application program files and user data provided by the host. Furthermore, the data to be compressed may also include metadata.

The compression processing unit 12 compresses and outputs data of a first size unit. For example, the first size unit may be set to be equal to an ECC encoding processing size unit. Alternatively, the first size unit may be set to be equal to a sector size unit.

For example, the compression processing unit 12 may compress data by using a run-length encoding method or a Huffman coding method. The run-length encoding method is a compression method in which the same values continuously appearing in data are represented as a data type and the number of repeats.

The decompression processing unit 13 receives compressed data from the memory device 20 and decompresses the compressed data into a status before the compression under the control of the CPU 11. The decompression processing unit 13 may decompress the compressed data by applying the compression principle of the compression processing unit 12 in a reverse method.

The ECC processing unit 14 may generate ECC information corresponding to data received from the host in a write operation by using an algorithm, such as Reed-Solomon (RS) code, Hamming code, or cyclic redundancy code (CRC), etc., but is not limited thereto. For example, the ECC information may include parity information or RAID parity information.

The RAID parity information is ECC information generated to be able to restore one piece of ECC processing unit information for which error correction is impossible from among a plurality of pieces of ECC processing unit information. For example, the RAID parity information may be generated by XOR-operating corresponding one-bit values from the plurality of pieces of ECC processing unit information.

In detail, the ECC processing unit 14 may generate a first bit value of the RAID parity information by XOR-operating a first bit value of each of the plurality of pieces of ECC processing unit information. Next, the ECC processing unit 14 may generate a second bit value of the RAID parity information by extracting a second bit value of each of the plurality of pieces of ECC processing unit information. In this manner, the RAID parity information may be generated by sequentially XOR-operating up to a last bit value of each of the plurality of pieces of ECC processing unit information.

In a read operation, the ECC processing unit 14 performs ECC processing of received data by using ECC information read together with the received data.

When the same ECC algorithm is used, it is characterized that an error correction capability per unit data size increases in proportional to an ECC size. For example, if an ECC size of 112 bytes per 4K-byte page is required in an ECC algorithm in which a bit error of 1024-byte data is processed up to 16 bits or less, an ECC size of 224 bytes per 4K-byte page is required in an ECC algorithm in which a bit error of 1024-byte data is processed up to 32 bits or less. That is, to improve an error correction capability of a processible bit error per 4K-byte page from 16 bits to 32 bits, an ECC size may double.

In the current embodiment of the present general inventive concept, a method of increasing an ECC strength while using the same ECC algorithm without changing the ECC algorithm is suggested. In detail, a method of using a spare storage area of the memory device 20 secured through data compression as an area to store additional ECC information to increase the ECC strength is suggested.

For example, the ECC strength may be increased by generating a plurality of types of ECC information based on compressed data and storing the plurality of types of ECC information in the spare storage area of the memory device 20 secured through data compression. This will be described below in detail.

First, a principle of generating a plurality of types of ECC information by dividing compressed data into two pieces of divided compressed data and storing the plurality of types of ECC information in a spare storage area of the memory device 20 secured through data compression will now be described.

Figure 21:
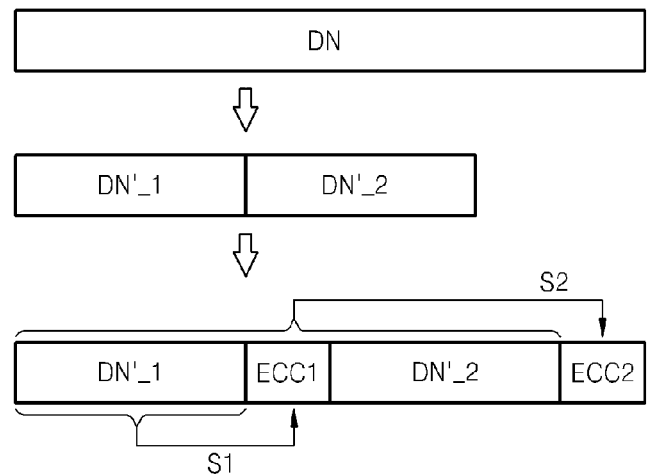
FIG. 21 is a conceptual diagram illustrating a principle of dividing compressed data into two pieces of divided compressed data, generating a plurality of types of ECC information, and storing the two pieces of divided compressed data and the plurality of types of ECC information in a memory device, according to an exemplary embodiment of the present general inventive concept.

Referring to FIG. 21, for example, compressed data DN' may be obtained by compressing original data DN of an ECC encoding processing size unit. The compressed data DN' may be divided into, for example, 2 pieces of divided compressed data DN'_1 and DN'_2. Thereafter, according to an exemplary embodiment of the present general inventive concept, in operation S1, a first type of ECC information ECC1 is generated by firstly performing ECC encoding processing of DN'_1. In operation S2, a second type of ECC information ECC2 is generated by secondly performing ECC encoding processing of (DN'_1+ECC1+DN'_2). As described above, after firstly and secondly performing the ECC encoding processing, (DN'_1+ECC1+DN'_2+ECC2) may be stored in the memory device 20 by using a spare storage area secured through data compression.

Next, the principle of generating a plurality of types of ECC information by dividing compressed data into three pieces of divided compressed data and storing the plurality of types of ECC information in a spare storage area of the memory device 20 secured through data compression will be described.

Figure 22:
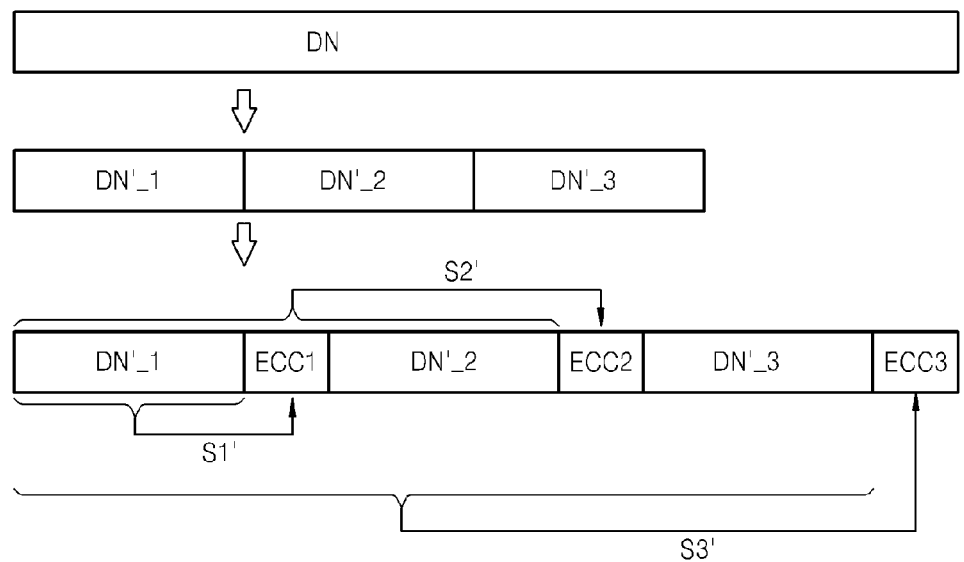
FIG. 22 is a conceptual diagram illustrating a principle of dividing compressed data into three pieces of divided compressed data, generating a plurality of types of ECC information, and storing the three pieces of divided compressed data and the plurality of types of ECC information in a memory device, according to another exemplary embodiment of the present general inventive concept.

Referring to FIG. 22, for example, compressed data DN' may be obtained by compressing original data DN of an ECC encoding processing size unit. The compressed data DN' may be divided into, for example, 3 pieces of divided compressed data DN'_1, DN'_2, and DN'_3. Thereafter, according to an exemplary embodiment of the present general inventive concept, in operation S1', a first type of ECC information ECC1 is generated by first performing ECC encoding processing of DN'_1. In operation S2', a second type of ECC information ECC2 is generated by performing a second ECC encoding processing of (DN'_1+ECC1+DN'_2). In operation S3', a third type of ECC information ECC3 is generated by performing a third ECC encoding processing of (DN'_1+ECC1+DN'_2+ECC2+DN'_3).

As described above, after the first, second, and third performances of the ECC encoding processing, (DN'_1+ECC1+DN'_2+ECC2+DN'_3+ECC3) may be stored in the memory device 20 by using a spare storage area secured through data compression.

By using the principles as described above, a plurality of types of ECC information may be generated by dividing compressed data into three or more pieces of divided compressed data, and the plurality of types of ECC information may be stored in the memory device 20 by using a spare storage area secured through data compression.

An exemplary embodiment of the present general inventive concept of increasing the ECC strength by dividing compressed data into two pieces of divided compressed data to generate a plurality of types of ECC information and storing the plurality of types of ECC information in a spare storage area of the memory device 20, which is secured through data compression will be mainly described below.

The ECC processing unit 14 generates ECC information by performing padding processing of compressed data with invalid data and applying an ECC algorithm to the padding-processed compressed data. The padding processing may be performed by adding initially set invalid data to the compressed data so that data sizes before and after data compression are the same. The invalid data may be called padding information. For example, the invalid data may be set to 0 (zero) for all bit values included in a region to be padded. As another example, the invalid data may be set to 1 (one) corresponding to all bit values included in a region to be padded.

The ECC processing unit 14 may generate a plurality of types of ECC information based on compressed data.

The CPU 11 divides compressed data output from the compression processing unit 12 into a plurality of pieces of divided compressed data and delivers the plurality of pieces of divided compressed data to the ECC processing unit 14.

The ECC processing unit 14 may perform padding processing of the plurality of pieces of divided compressed data by adding initially set invalid data to at least one of the plurality of pieces of divided compressed data and generate first parity information that is ECC information by first performing ECC encoding processing of the plurality of pieces of padding-processed divided compressed data.

Figure 23:
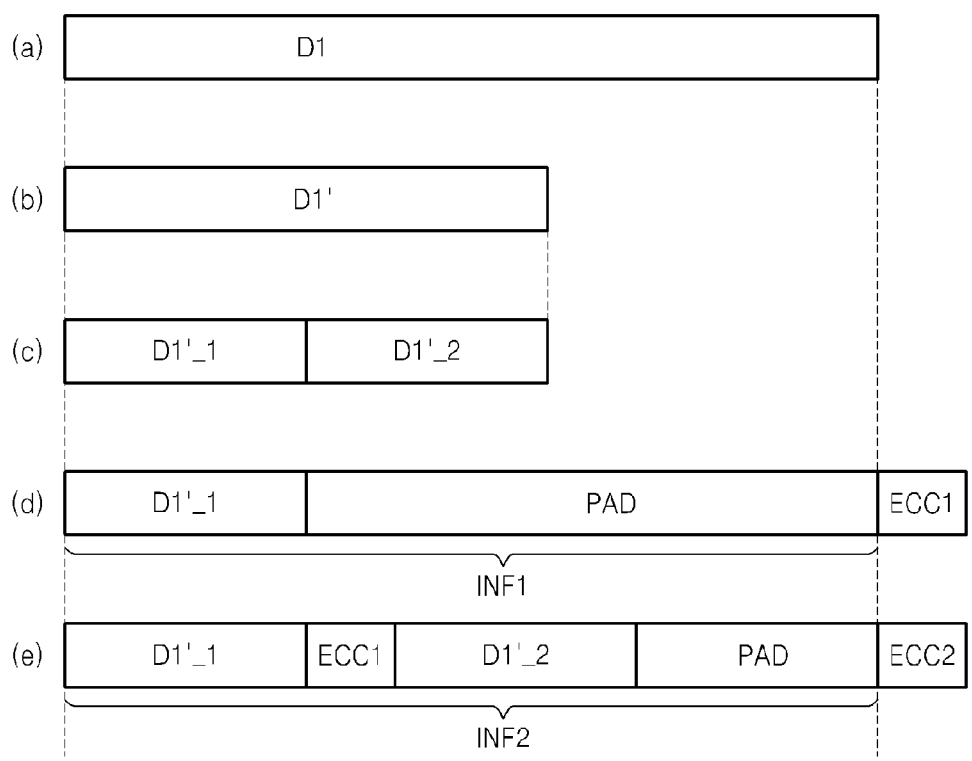
FIG. 23 illustrates conceptual diagrams describing a process of performing a write operation in a memory system, according to an exemplary embodiment of the present general inventive concept.

For example, as illustrated in views (a) through € of FIG. 23, when compressed data D1' compression-processed from original data D1 is divided into two pieces of divided compressed data D1'_1 and D1'_2, the ECC processing unit 14 may generate first parity information ECC1 that is ECC information by firstly performing ECC encoding processing of the divided compressed data D1'_1.

Also, the ECC processing unit 14 may generate second parity information ECC2 by secondly performing ECC encoding processing of information, which includes the compressed data D1'_1 for which the first parity information ECC1 has been generated, the first parity information ECC1, and the compressed data D1'_2 for which the first parity information ECC1 has not been generated.

For example, as illustrated in FIG. 23, the ECC processing unit 14 may generate the second parity information ECC2 by secondly performing ECC encoding processing of (D1'_1+ECC1+D1'_2).

As another example, the ECC processing unit 14 may generate RAID parity information by using a plurality of pieces of ECC processing unit information. The ECC processing unit may be determined as, for example, a sector size unit. Thus, the ECC processing unit 14 may generate RAID parity information to restore one piece of sector data by using a plurality of pieces of sector data.

In a read operation, the ECC processing unit 14 may perform ECC processing at least once with compressed data included in read data, which has been received from the memory device 20, based on a plurality of types of ECC information included in the read data.

The ECC processing unit 14 may perform first ECC processing of the compressed data included in the read data based on a first type of ECC information from among the plurality of types of ECC information included in the read data.

For example, the ECC processing unit 14 may firstly perform ECC processing of information, which includes a portion of the compressed data for which first parity information has been generated, the first parity information, and a portion of the compressed data for which the first parity information has not been generated, based on second parity information acquired from the read data.

If error correction has failed in the result of the first ECC processing, the CPU 11 may control the ECC processing unit 14 to perform second ECC processing of the compressed data included in the read data based on a second type of ECC information from among the plurality of types of ECC information.

For example, if error correction has succeeded in the result of the second ECC processing, the CPU 11 may control the ECC processing unit 14 to perform ECC processing of information, which includes a portion of the compressed data for which the second ECC processing has been performed, the first parity information, and a portion of the compressed data for which the first parity information has not been generated, based on the second parity information acquired from the read data.

According to another exemplary embodiment of the present general inventive concept, the ECC processing unit 14 may first perform ECC processing of the compressed data included in the read data based on third parity information acquired from the read data.

If error correction has failed in the result of the first ECC processing, the CPU 11 may control the ECC processing unit 14 to decompress the compressed data for which the error correction has failed by secondly performing ECC processing by using RAID parity information acquired from the read data.

Figure 2:
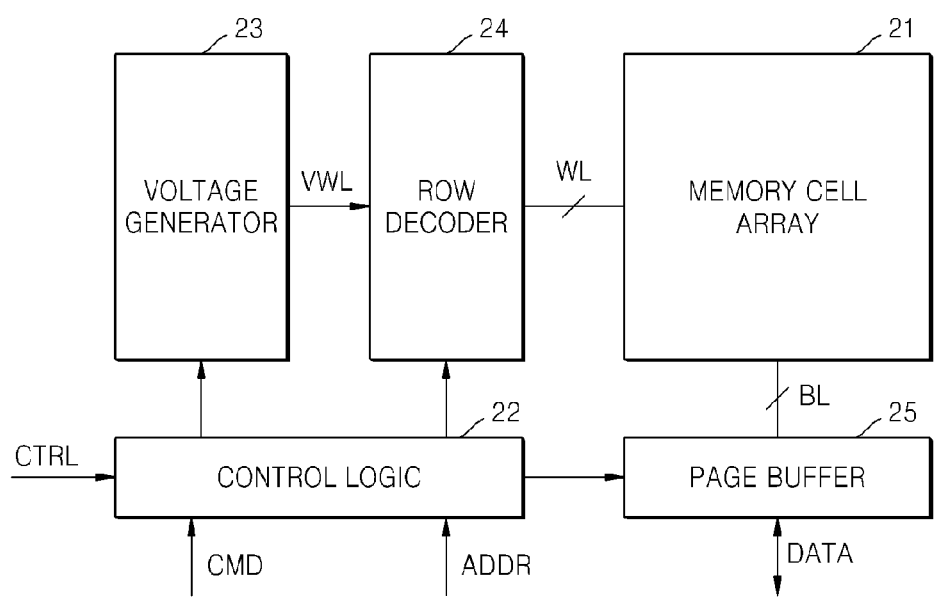
FIG. 2 is a detailed block diagram of a memory device included in the memory system of FIG. 1, according to an exemplary embodiment of the present general inventive concept.

FIG. 2 is a block diagram of the memory device 20 included in the memory system 100 of FIG. 1, according to an exemplary embodiment of the present general inventive concept.

Referring to FIG. 2, the memory device 20 may include a memory cell array 21, a control logic 22, a voltage generator 23, a row decoder 24, and a page buffer 25.

The control logic 22 may output various types of control signals to write data into the memory cell array 21 or to read data from the memory cell array 21, based on a command CMD, an address ADDR, and a control signal CTRL received from the memory controller 10. The control signals output from the control logic 22 may be transmitted to the voltage generator 23, the row decoder 24, and the page buffer 25, respectively.

The voltage generator 23 may generate a driving voltage VWL to drive a plurality of word lines WL based on the control signal received from the control logic 22. In detail, the driving voltage VWL may be a write voltage (or a program voltage), a read voltage, an erase voltage, or a pass voltage.

The row decoder 24 may activate some of the plurality of word lines WL based on a row address. In detail, in a read operation, the row decoder 24 may apply the read voltage to selected word lines WL and apply the pass voltage to non-selected word lines WL. In a write operation, the row decoder 24 may apply the write voltage to selected word lines WL and apply the pass voltage to non-selected word lines WL.

The page buffer 25 may be connected to the memory cell array 21 via a plurality of bit lines BL. The page buffer 25 may temporarily store data to be written into the memory cell array 21 or data read from the memory cell array 21.

Figure 3:
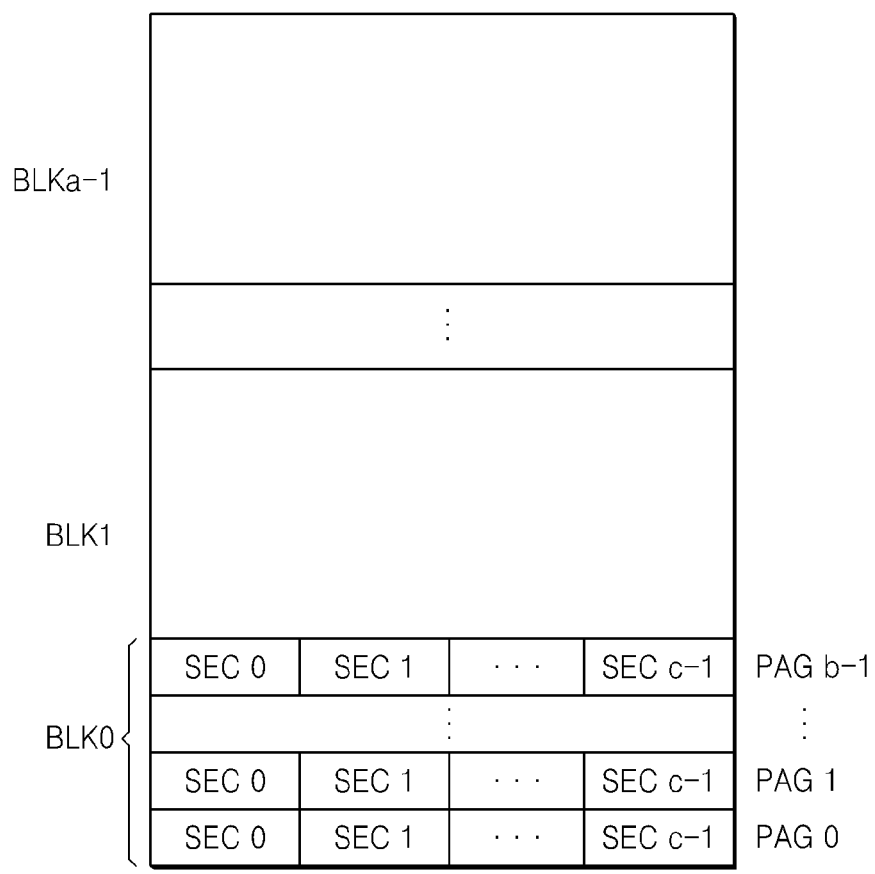
FIG. 3 illustrates a memory cell array included in the memory device of FIG. 2, according to an exemplary embodiment of the present general inventive concept.

FIG. 3 illustrates the memory cell array 21 included in the memory device 20 of FIG. 2, according to an exemplary embodiment of the present general inventive concept.

Referring to FIG. 3, the memory cell array 21 may be a flash memory cell array. As such, the memory cell array 21 may include a blocks BLK0 through BLKa-1 (where a is an integer equal to or greater than 2), the blocks BLK0 through BLKa-1 each including b pages PAG0 through PAGb-1 (where b is an integer equal to or greater than 2), the pages PAG0 through PAGb-1 each including c sectors SEC0 through SECc-1 (where c is an integer equal to or greater than 2). Although FIG. 3 illustrates the pages PAG0 through PAGb-1 and the sectors SEC0 through SECc-1 corresponding to only the block BLK0 for convenience of illustration, the other blocks BLK1 through BLKa-1 may also have the same structure as the block BLK0.

Figure 4:
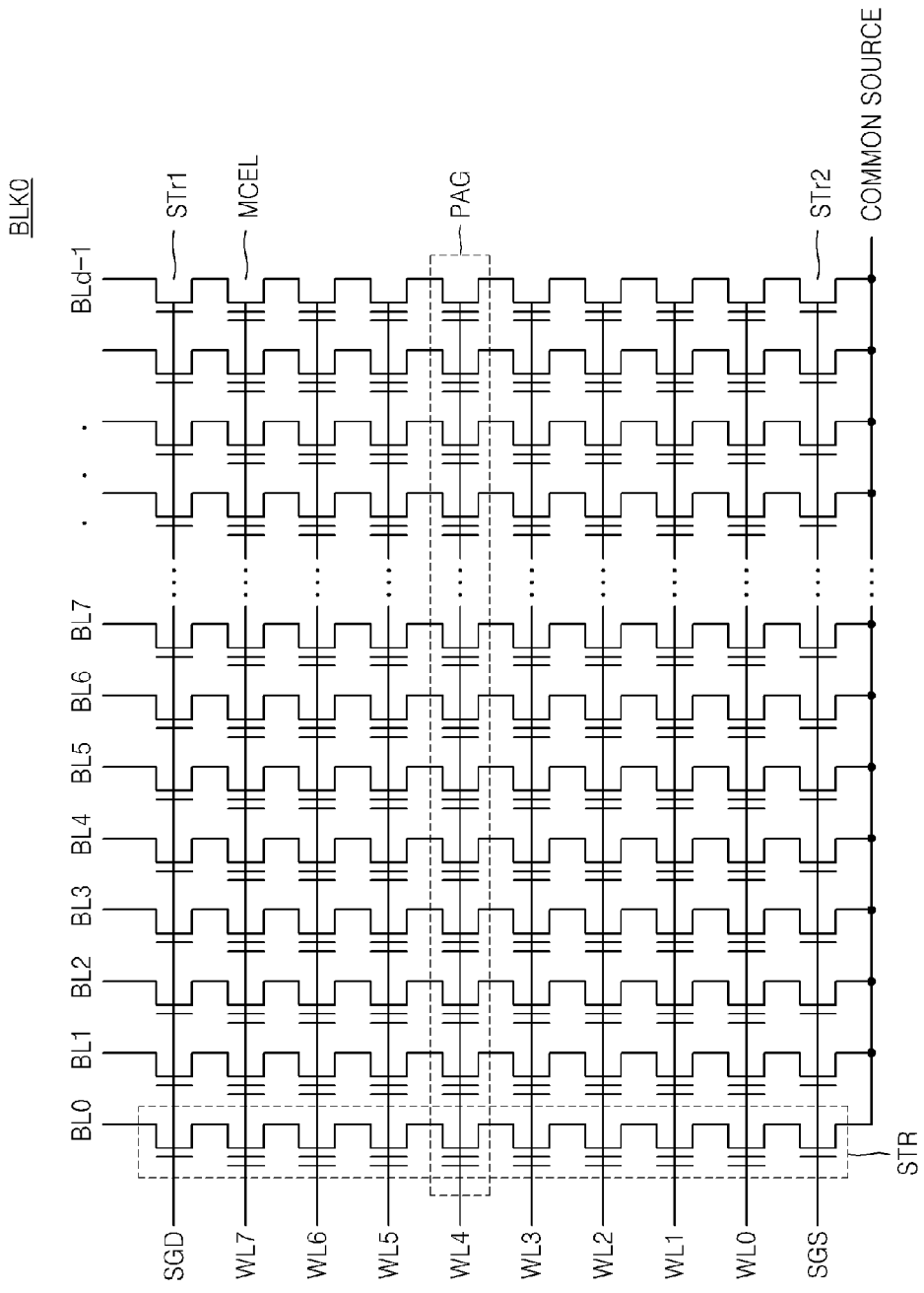
FIG. 4 is a circuit diagram of a memory block included in the memory cell array of FIG. 3, according to an exemplary embodiment of the present general inventive concept.

FIG. 4 is a circuit diagram of the memory block BLK0 included in the memory cell array 21 of FIG. 3, according to an exemplary embodiment of the present general inventive concept.

Referring to FIG. 4, the memory cell array 21 may be a memory cell array of a NAND flash memory. In this case, each of the blocks BLK0 through BLKa-1 illustrated in FIG. 3 may be implemented as illustrated in FIG. 4. Referring to FIG. 4, each of the blocks BLK0 through BLKa-1 may include d strings STR (where d is an integer equal to or greater than 2) in which 8 memory cells MCEL are connected in series in a direction of bit lines BL0 through BLd-1. Each string STR may include a drain select transistor STr1 and a source select transistor STr2, which are connected to both ends of the memory cells MCEL connected in series.

A NAND flash memory device having a structure as illustrated in FIG. 4 performs an erase operation in units of a block and performs a program operation in units of a page PAG corresponding to each of word lines WL0 through WL7. FIG. 4 illustrates an example in which one block includes 8 pages PAG corresponding to the 8 word lines WL0 through WL7. However, according to an exemplary embodiment of the present general inventive concept, the blocks BLK0 through BLKa-1 of the memory cell array 21 may include a different number of memory cells and pages from those of the memory cells MCEL and pages PAG illustrated in FIG. 4. In addition, the memory device illustrated in FIGS. 1 and 2 may include a plurality of memory cell arrays performing the same operation in the same structure as the memory cell array 21 described above.

Figure 5:
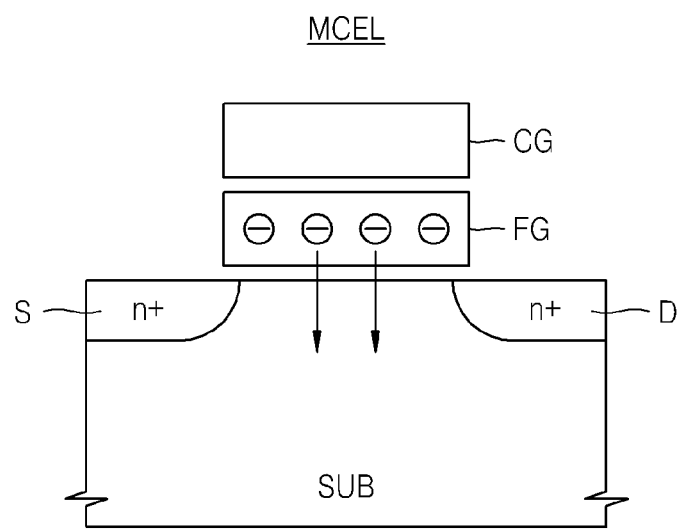
FIG. 5 is a cross-sectional view of a memory cell included in the memory block of FIG. 4, according to an exemplary embodiment of the present general inventive concept.

FIG. 5 is a cross-sectional view of a memory cell MCEL included in the memory block BLK0 of FIG. 4, according to an exemplary embodiment of the present general inventive concept.

Referring to FIG. 5, a source S and a drain D may be formed on a substrate SUB, and a channel region may be formed between the source S and the drain D. A floating gate FG may be formed on the channel region, and an insulation layer, such as a tunneling insulation layer, may be disposed between the channel region and the floating gate FG. A control gate CG may be formed on the floating gate FG, and an insulation layer, such as a blocking insulation layer, may be disposed between the floating gate FG and the control gate CG. Voltages required to perform program, erase, and read operations corresponding to the memory cell MCEL may be applied to the substrate SUB, the source S, the drain D, and the control gate CG.

In a flash memory device, data stored in the memory cell MCEL may be read according to a threshold voltage Vth of the memory cell MCEL. The threshold voltage Vth of the memory cell MCEL may be determined according to a quantity of electrons stored in the floating gate FG. In detail, the more the electrons stored in the floating gate FG, the higher the threshold voltage Vth of the memory cell MCEL.

The electrons stored in the floating gate FG may be leaked in a direction of arrows due to various causes, and accordingly, the threshold voltage Vth of the memory cell MCEL may vary. For example, the electrons stored in the floating gate FG may be leaked due to wear of the memory cell MCEL. In detail, when an access operation, such as a program, erase, or read operation, to the memory cell MCEL is repeated, an insulation film between the channel region and the floating gate FG may be worn, and accordingly, the electrons stored in the floating gate FG may be leaked. As another example, the electrons stored in the floating gate FG may be leaked due to a high-temperature stress or a temperature difference in a program/read operation. This leakage phenomenon may cause a decrease in reliability of the memory device 20.

In a flash memory device, write and read operations of data are performed in units of a page, and an electrical erase operation is performed in units of a block. In addition, an electrical erase operation is required before a write operation. Thus, an overwrite operation is impossible.

In a memory device for which an overwrite operation is impossible, user data cannot be written in a physical area desired by a user. Thus, when an access for a write or read operation is requested from a host, an address translation operation for translating a logical address at which the write or read operation is requested from the host into a physical address at which data is actually stored or is to be stored is required.

A process of translating a logical address into a physical address in the memory system 100 will be described with reference to FIG. 6.

Figure 6:
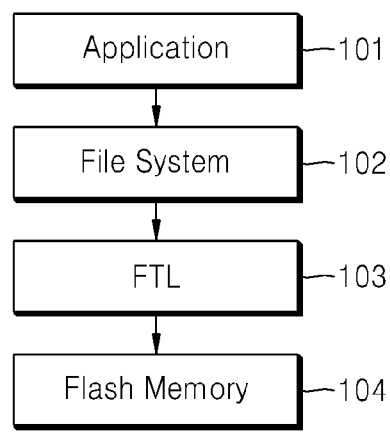
FIG. 6 is a software structure of the memory system of FIG. 1, according to an exemplary embodiment of the present general inventive concept.

FIG. 6 is a software structure of the memory system 100 of FIG. 1, according to an exemplary embodiment of the present general inventive concept. FIG. 6 illustrates a software structure of the memory system 100 when the memory device 20 included in the memory system 100 is implemented as a flash memory device.

Referring to FIG. 6, the memory system 100 has a software's hierarchical structure in an order of an application 101, a file system 102, a flash translation layer (FTL) 103, and a flash memory 104. The flash memory 104 physically indicates the memory device 20 illustrated in FIG. 2.

The application 101 indicates firmware to process user data. For example, the application 101 may be document processing software such as a word processor, calculation software, or a document viewer such as a web browser. The application 101 processes user data in response to an input of a user and transmits a command to store the processed user data in the flash memory 104 to the file system 102.

The file system 102 indicates a structure or software used to store user data in the flash memory 104. The file system 102 assigns a logical address at which the user data is stored in response to the command from the application 101. Examples of the file system 102 are a file allocation table (FAT) file system, a new technology file system (NTFS), etc.

The FTL 103 performs a process of translating the logical address received from the file system 102 into a physical address for a read/write operation in the flash memory 104. The FTL 103 translates the logical address into the physical address by using mapping table information. As an address mapping method, a page mapping method or a block mapping method may be used. The page mapping method is a method of performing an address mapping operation in units of a page, and the block mapping method is a method of performing an address mapping operation in units of a block. Alternatively, a mixed mapping method in which page mapping and block mapping are mixed may be used. The physical address indicates a data storage position in the flash memory 104.

Figure 7:
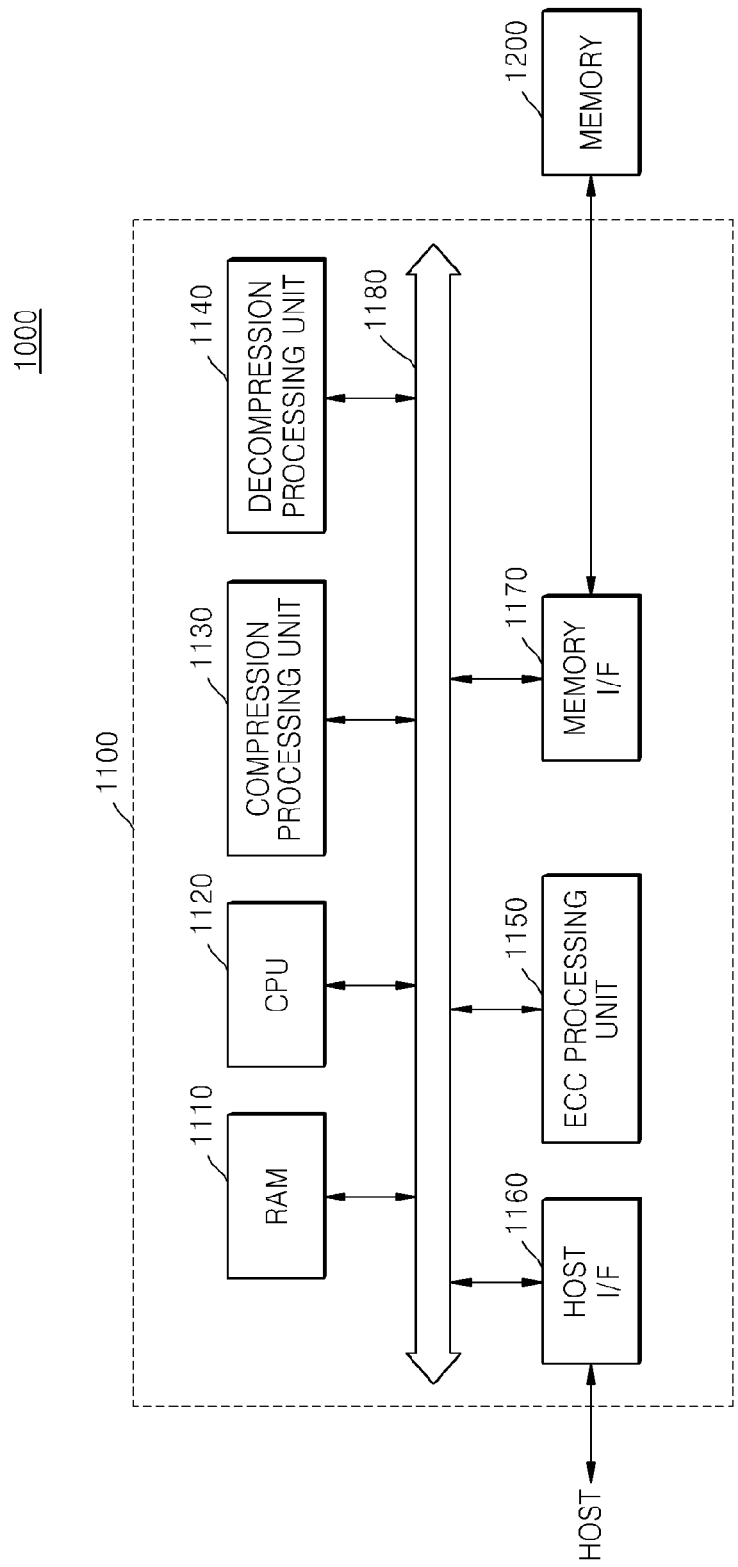
FIG. 7 is a block diagram of a memory system according to another exemplary embodiment of the present general inventive concept.

FIG. 7 is a block diagram of a memory system 1000 according to another exemplary embodiment of the present general inventive concept.

Referring to FIG. 7, the memory system 1000 may include a memory controller 1100 and a memory device 1200.

The memory device 1200 may be implemented by a nonvolatile semiconductor memory device, in detail, a flash memory, a PRAM, a ferroelectric RAM (FRAM), an MRAM, or the like. Since the memory device 1200 has substantially the same components as the memory device 20 shown in FIG. 1, a description thereof is not repeated.

For example, when the memory device 1200 is implemented by a nonvolatile semiconductor memory device, such as a flash memory, the memory system 1000 may be a solid state drive (SSD). The memory controller 1100 controls an erase, write, or read operation in the memory device 1200 in response to a command received from a host.

The memory controller 1100 may include a RAM 1110, a CPU 1120, a compression processing unit 1130, a decompression processing unit 1140, an ECC processing unit 1150, a host interface 1160, a memory interface 1170, and a bus 1180.

The bus 1180 indicates a transmission path through which data is transmitted between components of the memory controller 1100.

The CPU 1120 controls a general operation of the memory system 1000. For example, the CPU 1120 controls the memory system 1000 to interpret a command received from a host and perform an operation according to an interpreted result.

The CPU 1120 provides a read command and an address to the memory device 1200 in a read operation and provides a write command, an address, and data to the memory device 1200 in a write operation. In addition, the CPU 1120 may perform a process of translating a logical address into a physical address.

The CPU 1120 controls the memory system 1000 to perform a write or read operation in the memory system 1000, which is proposed in the current exemplary embodiment. For example, the CPU 1120 may control the memory system 1000 to perform a method of performing a write operation or a read operation in the memory system 1000 according to exemplary embodiments of the present general inventive concept illustrated in FIGS. 8 through 20.

The RAM 1110 temporarily stores data transmitted from the host or data read from the memory device 1200. In addition, the RAM 1110 also stores data required to perform a memory system control, which is read from the memory device 1200. For example, the data required for a memory system control may include metadata. The RAM 1110 may be implemented by a dynamic RAM (DRAM), a static RAM (SRAM), etc., but is not limited thereto.

As a reference, the metadata may include information for managing the memory system 1000. The metadata that is management information may include mapping table information used to translate a logical address into a physical address of the memory device 1200.

The host interface 1160 has a data exchange protocol to exchange data with a host connected to the memory system 1000 and mutually connects the memory system 1000 and the host. The host interface 1160 may be implemented by an Advanced Technology Attachment (ATA) interface, a Serial Advanced Technology Attachment (SATA) interface, a Parallel Advanced Technology Attachment (PATA) interface, a Universal Serial Bus (USB) or Serial Attached Small Computer System (SAS) interface, a Small Computer System Interface (SCSI), an embedded Multi Media Card (eMMC) interface, or a Unix File System (UFS) interface. However, the above interface types are only illustrative, and the host interface 1160 is not limited thereto. In detail, the host interface 1160 may exchange a command, an address, and data with the host under control of the CPU 1120.

The memory interface 1170 is electrically connected to the memory device 1200. The memory interface 1170 exchanges a command, an address, and data with the memory device 1200 under the control of the CPU 1120. The memory interface 1170 may be formed to support a NAND flash memory or a NOR flash memory. The memory interface 1170 may be formed to selectively perform software and hardware interleave operations through a plurality of channels.

Since the compression processing unit 1130, the decompression processing unit 1140, and the ECC processing unit 1150 perform substantially the same operations of the compression processing unit 12, the decompression processing unit 13, and the ECC processing unit 14 illustrated in FIG. 1, a description thereof is not repeated.

A method of performing a write operation or a read operation in the memory system 1000 under the control of the CPU 1120 will now be described in detail with reference to the flowcharts of FIGS. 8 through 20.

First, a method of performing a write operation in the memory system 1000 according to an exemplary embodiment of the present general inventive concept will now be described with reference to FIG. 8.

In a write operation mode, the CPU 1120 divides data, which is stored in the RAM 1110, in units of a first size, via the host interface 1160, and applies the data of the first size unit to the compression processing unit 1130. In operation S110, the compression processing unit 1130 compresses the data of the first size unit. For example, the first size unit may be determined as an ECC encoding processing size unit. Alternatively, the first size unit may be determined as a sector size unit.

Referring to FIG. 23, when the compression processing unit 1130 compresses data D1 of the first size unit as illustrated in view (a) of FIG. 23, size-reduced compressed data D1' as illustrated in view (b) of FIG. 23 is generated.

In operation S120, the CPU 1120 controls the memory system 1000 to generate a plurality of types of ECC information based on compressed data.

For example, under the control of the CPU 1120, the ECC processing unit 1150 may generate first parity information that is a first type of ECC information by adding initially set invalid data to a portion of a plurality of pieces of divided compressed data to perform padding processing and firstly performing ECC encoding processing of the padding-processed portion of compressed data. In addition, under the control of the CPU 1120, the ECC processing unit 1150 may generate second parity information that is a second type of ECC information by secondly performing ECC encoding processing of information, which includes the portion of compressed data for which the first parity information has been generated, the first parity information, and a portion of compressed data for which the first parity information has not been generated.

In operation S130, the CPU 1120 combines the compressed data generated by the compression processing unit 1130 and the plurality of types of ECC information generated by the ECC processing unit 1150 in units of a second size and transmits the information combined in the second size unit to the memory interface 1170. For example, the second size unit may be determined as a page size unit of the memory device 1200. In addition, a plurality of pieces of sector data may be stored in a single page.

In operation S140, the CPU 1120 generates control signals for writing the information combined in units of the second size, which has been transmitted to the memory interface 1170, in the memory device 1200. Accordingly, when the second size unit is determined as a page size unit, compressed data and a plurality of types of ECC information, which are combined, are written in the memory device 1200 in units of a page size.

Figure 8:
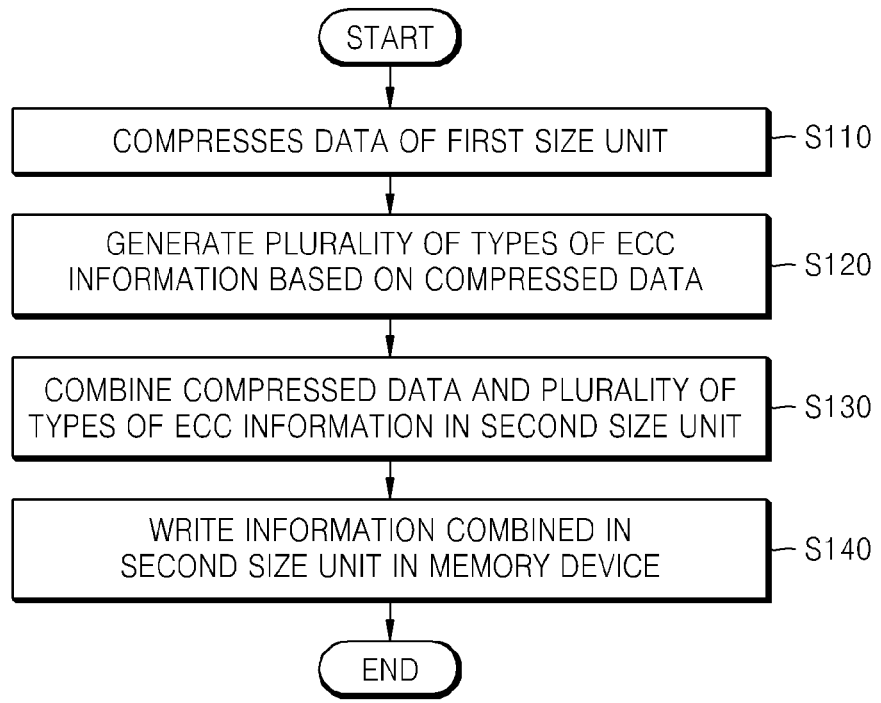
FIG. 8 is a flowchart illustrating a method of performing a write operation in a memory system, according to an exemplary embodiment of the present general inventive concept.
Figure 9:
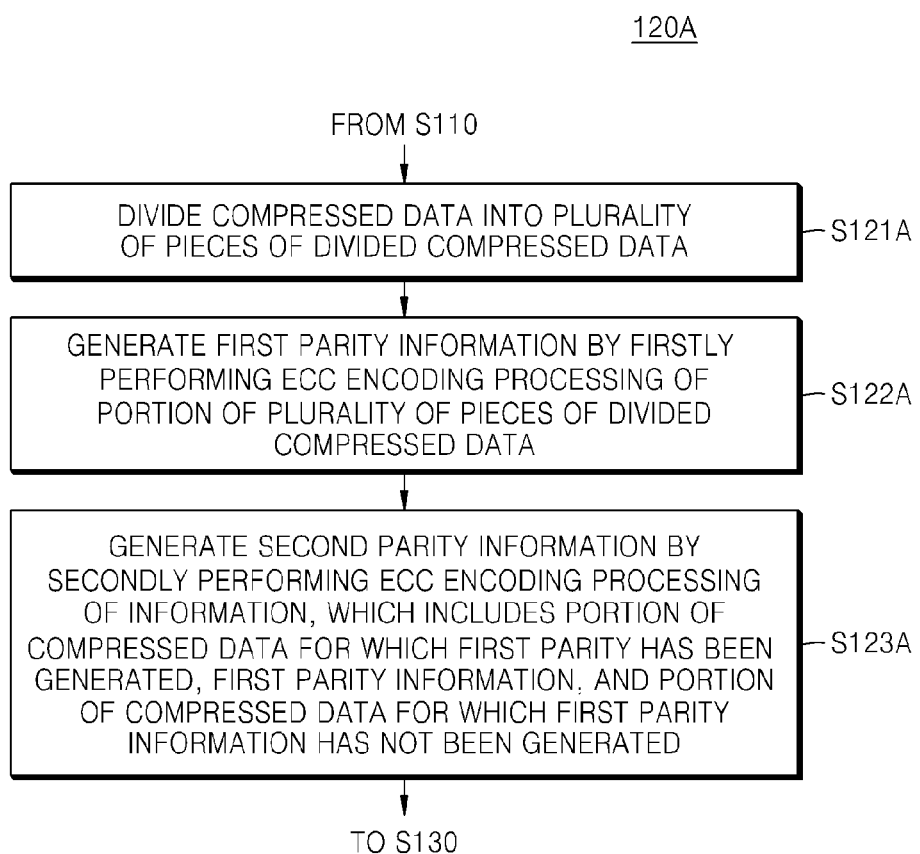
FIG. 9 is a detailed flowchart illustrating a method of generating a plurality of types of Error Checking and Correction (ECC) information in the method of FIG. 8, according to an exemplary embodiment of the present general inventive concept.

FIG. 9 is a detailed flowchart illustrating operation S120 (S120A) of generating a plurality of types of ECC information in the method of FIG. 8, according to an exemplary embodiment of the present general inventive concept.

Operations according to the detailed flowchart of operation S120A of generating a plurality of types of ECC information according to an exemplary embodiment of the present general inventive concept, which are illustrated in FIG. 9, are as follows.

In operation S121A, the CPU 1120 divides the compressed data generated by the compression processing unit 1130 into a plurality of pieces of divided compressed data. Referring to views (a) through (e) of FIG. 23, the compressed data D1' is divided into two pieces of divided compressed data D1'_1 and D1'_2. Although the compressed data is divided into two pieces of divided compressed data in the current exemplary embodiment, the compressed data may be divided into three or more pieces of divided compressed data.

In operation S122A, the CPU 1120 controls the ECC processing unit 1150 to generate first parity information by firstly performing ECC encoding processing of a portion of the plurality of pieces of divided compressed data. For example, when the compressed data is divided into two pieces of divided compressed data, the first parity information may be generated by firstly performing ECC encoding processing of a portion (e.g., D1'_1 or D1'_2) of the two pieces of divided compressed data. For example, as illustrated in views (a) through (e) of FIG. 23, the compressed data D1' is divided into the two pieces of divided compressed data D1'_1 and D1'_2, the first parity information ECC1 may be generated by firstly performing ECC encoding processing of D1'_1 that is a portion of the divided compressed data D1'_1 and D1'_2.

In operation S123A, the CPU 1120 controls the ECC processing unit 1150 to generate second parity information by secondly performing ECC encoding processing of information, which includes the portion of compressed data for which the first parity information has been generated, the first parity information, and a portion of compressed data for which the first parity information has not been generated. For example, as illustrated in view (e) of FIG. 23, the second parity information ECC2 may be generated for information, which includes the portion D1'_1 of the compressed data for which the first parity information ECC1 has been generated, the first parity information ECC1, and the portion D1'_2 of the compressed data for which the first parity information ECC1 has not been generated.

Figure 10:
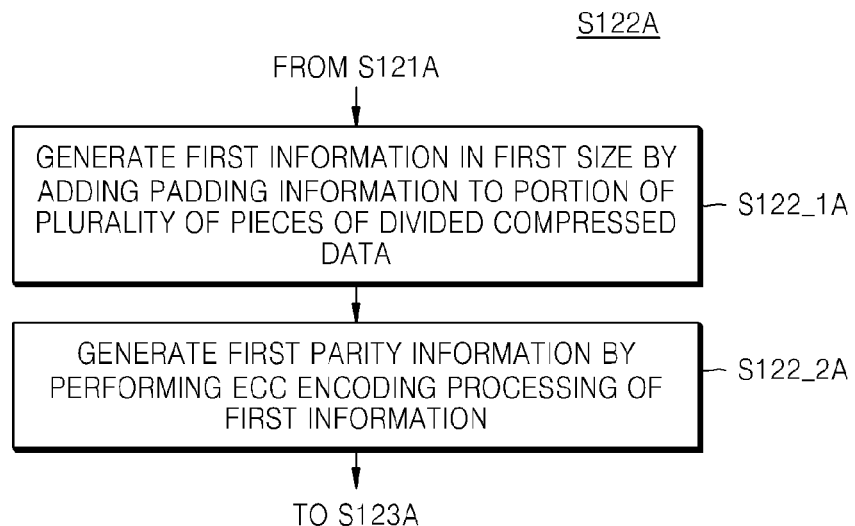
FIG. 10 is a detailed flowchart illustrating a method of generating first parity information in the method of FIG. 9, according to an exemplary embodiment of the present general inventive concept.

FIG. 10 is a detailed flowchart illustrating operation S122A of generating first parity information in the method of FIG. 9, according to an exemplary embodiment of the present general inventive concept.

In operation S122_1A, under the control of the CPU 1120, first information of a first size unit is generated by adding padding information to a portion of the plurality of pieces of divided compressed data. For example, as illustrated in view (d) of FIG. 23, first information INF1 of the first size unit is generated by adding padding information PAD to the divided portion D1'_1 of the compressed data. As an example, the first information INF1 may be generated by the ECC processing unit 1150. As another example, the first information INF1 may be generated by the CPU 1120.

In operation S122_2A, the ECC processing unit 1150 generates the first parity information by performing ECC encoding processing of the first information. For example, as illustrated in view (d) of FIG. 23, the ECC processing unit 1150 may generate the first parity information ECC1 of the first information INF1 of the first size unit, which is generated by adding the padding information PAD to the divided portion D1'_1 of the compressed data.

Figure 11:
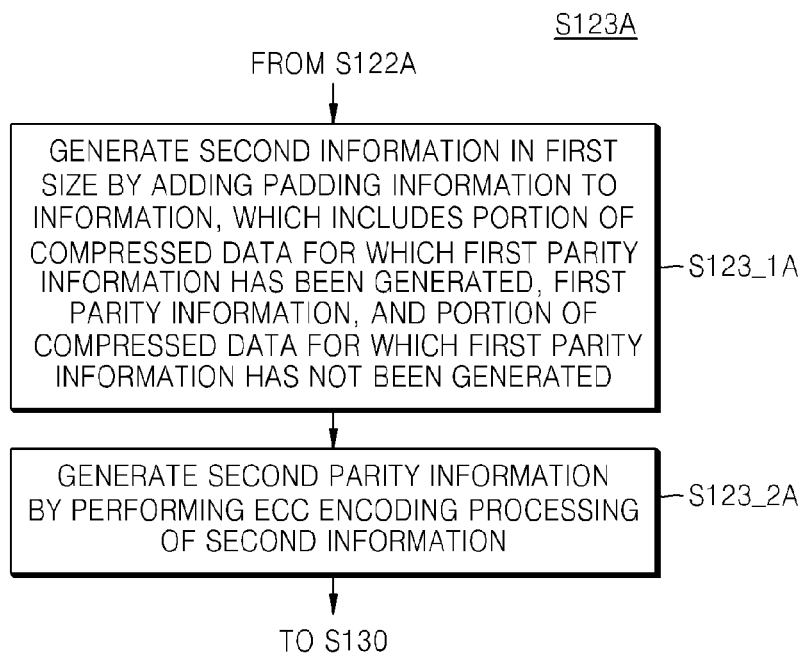
FIG. 11 is a detailed flowchart illustrating a method of generating second parity information in the method of FIG. 9, according to an exemplary embodiment of the present general inventive concept.

FIG. 11 is a detailed flowchart illustrating operation 123A of generating second parity information in the method of FIG. 9, according to an exemplary embodiment of the present general inventive concept.

In operation S123_1A, under control of the CPU 1120, second information in a first size is generated by adding padding information to information, which includes the portion of compressed data for which the first parity information has been generated, the first parity information, and a portion of compressed data for which the first parity information has not been generated. For example, as illustrated in view (e) of FIG. 23, second information INF2 of the first size unit is generated by adding the padding information PAD to the divided portion D1'_1 of the compressed data for which the first parity information ECC1 has been generated, the first parity information ECC1, and the divided portion D1'_2 of the compressed data for which the first parity information ECC1 has not been generated. As an example, the second information INF2 may be generated by the ECC processing unit 1150. As another example, the second information INF2 may be generated by the CPU 1120.

In operation S123_2A, the ECC processing unit 1150 generates the second parity information by performing ECC encoding processing of the second information. For example, as illustrated in view (e) of FIG. 23, the ECC processing unit 1150 may generate the second parity information ECC2 of (D1'_1+ECC1+D1'_2+PAD).

Figure 12:
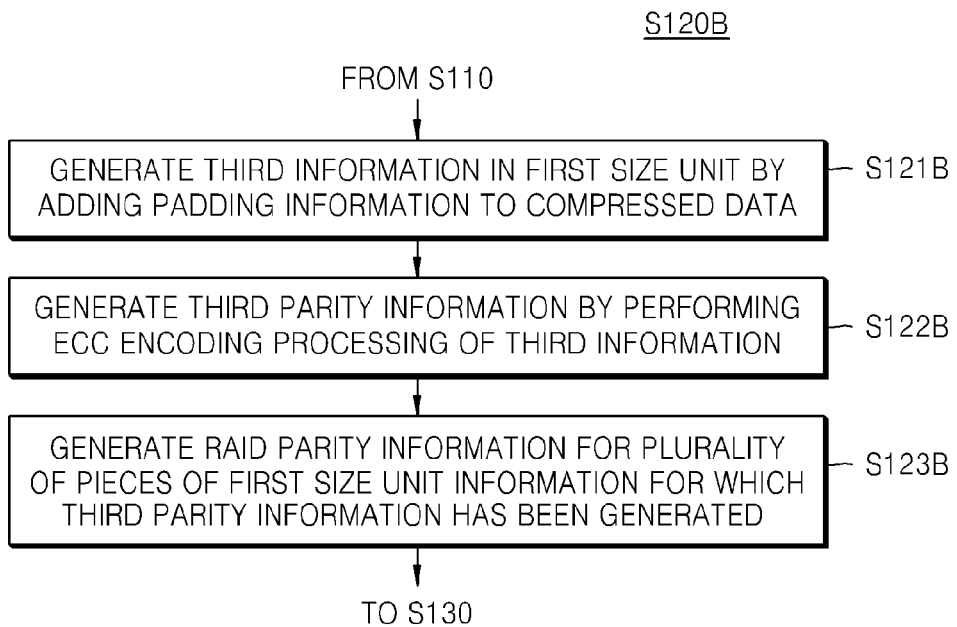
FIG. 12 is a detailed flowchart illustrating a method of generating a plurality of types of ECC information in the method of FIG. 8, according to another embodiment exemplary of the present general inventive concept.

FIG. 12 is a detailed flowchart illustrating operation 120 (120B) of generating a plurality of types of ECC information in the method of FIG. 8, according to another exemplary embodiment of the present general inventive concept.

Operations according to the detailed flowchart of operation S120B of generating a plurality of types of ECC information according to another exemplary embodiment of the present general inventive concept, which are illustrated in FIG. 12, are as follows.

Figure 24:
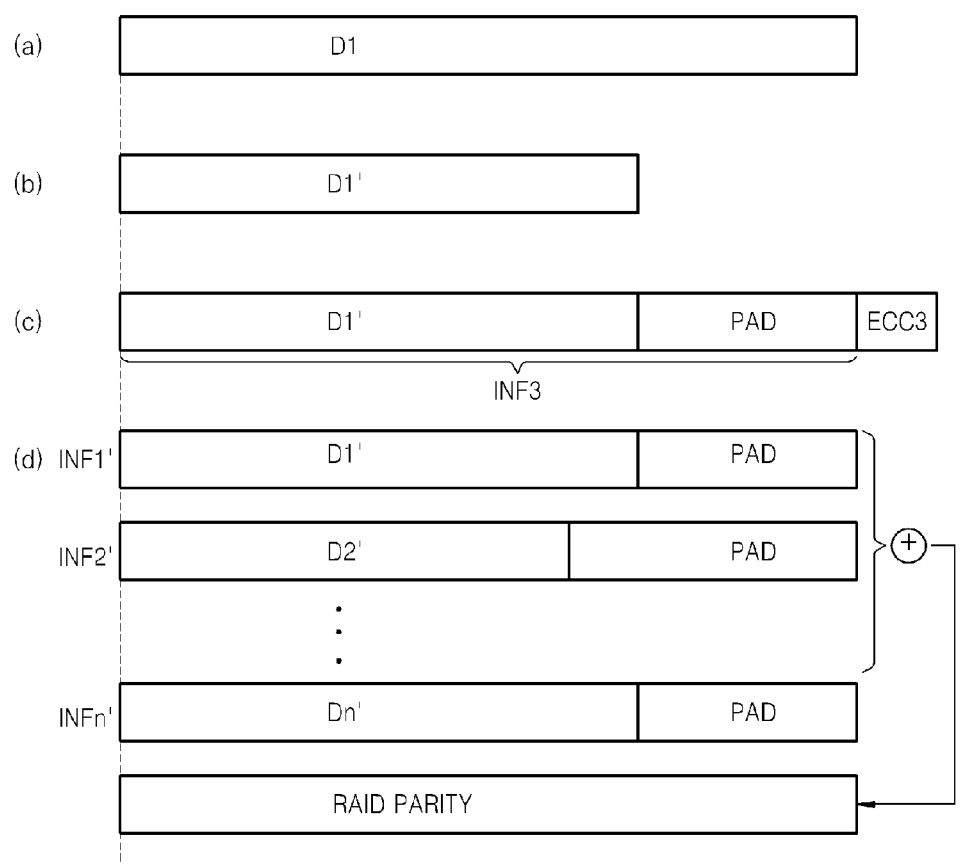
FIG. 24 illustrates conceptual diagrams describing a process of performing a write operation in a memory system, according to another exemplary embodiment of the present general inventive concept.

In operation S121B, under the control of the CPU 1120, third information of a first size unit is generated by adding padding information to the compressed data generated by the compression processing unit 1130. Referring to views (a) through (d) of FIG. 24, the compression processing unit 1130 generates the compressed data D1' by compressing the data D1 input in units of the first size. In addition, the compression processing unit 1130 generates third information INF3 of the first size unit by adding padding information PAD to the compressed data D1'. As an example, the third information INF3 may be generated by the ECC processing unit 1150. As another example, the third information INF3 may be generated by the CPU 1120.

In operation S122B, the ECC processing unit 1150 generates third parity information by performing ECC encoding processing of the third information. Referring to view (c) of FIG. 24, the ECC processing unit 1150 may generate the third information INF3 for (D1'+PAD).

In operation S123B, under control of the CPU 1120, the ECC processing unit 1150 generates RAID parity information for a plurality of pieces of first size unit information for which the third parity information has been generated. For example, the RAID parity information may be generated by XOR-operating respective one-bit values from the plurality of pieces of first size unit information. As illustrated in view (d) of FIG. 24, the RAID parity information may be generated by XOR-operating corresponding one-bit values from n pieces of first size unit information INF1' to INFn'. For example, n may be determined as the number of sectors stored in one page. In addition, the RAID parity information may be generated in page units.

Figure 13:
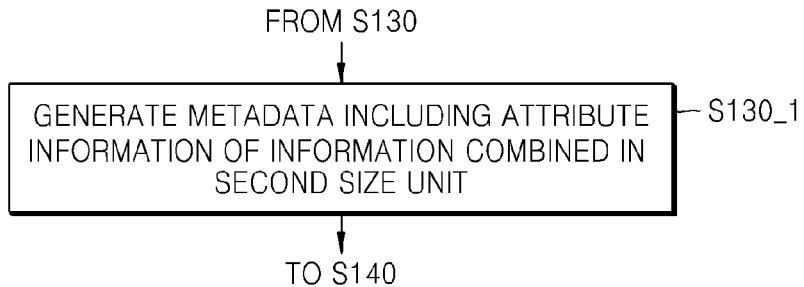
FIG. 13 is a flowchart illustrating a method of generating metadata, which is added to the method of FIG. 8, according to an exemplary embodiment of the present general inventive concept.

FIG. 13 is a flowchart illustrating operation S130_1 of generating metadata, which is added to the method of FIG. 8, according to an exemplary embodiment of the present general inventive concept.

The CPU 1120 controls the memory system 1000 to perform operation S130_1 of generating metadata before operation S140 after operation S130.

In operation S130_1, the CPU 1120 generates metadata including attribute information of the information combined in units of the second size after performing operation S130. For example, the attribute information may include information used to generate a plurality of types of ECC information or padding size information used to generate information of the first or second size unit. In detail, the attribute information may include information regarding the number of pieces of divided compressed data, information regarding a position at which the first parity information (e.g., ECC1) is stored, information regarding a position at which the divided portion (e.g., D1'_2) of the compressed data is stored, and so forth.

Figure 25:
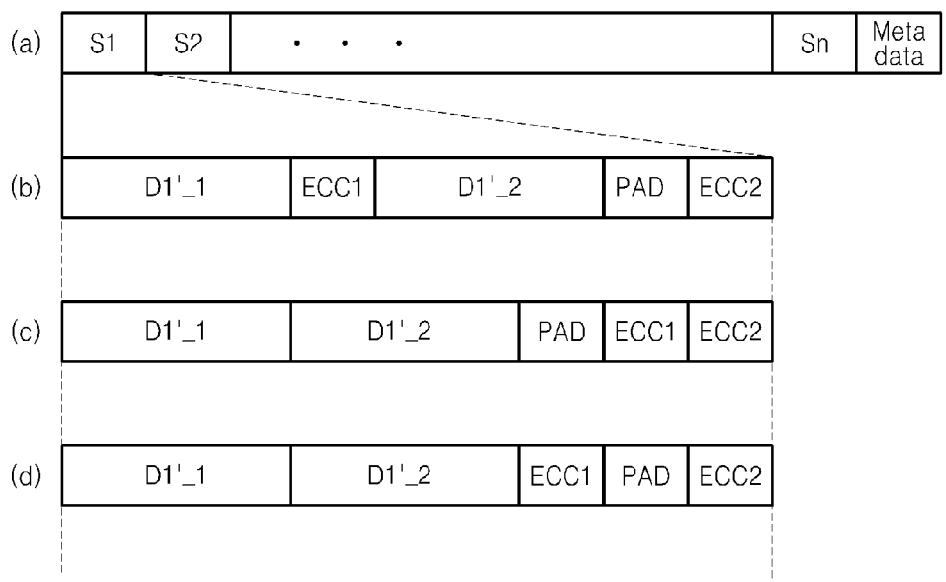
FIG. 25 illustrates various examples of a structure of data stored in one page of a memory device in the method of performing a write operation in a memory system, according to an exemplary embodiment of the present general inventive concept.

When operation S120A of generating a plurality of types of ECC information according to an embodiment of the inventive concept, as illustrated in FIG. 9, is applied, various examples of a structure of data stored in one page of the memory device 1200 are illustrated in views (a) through (d) of FIG. 25.

View (a) of FIG. 25 illustrates an example of a structure of data stored in one page.

As illustrated in view (a) of FIG. 25, a plurality of pieces of sector data S1 to Sn and metadata may be stored in one page. For example, a sector size may be set to be identical to an ECC encoding processing size of the memory controller 1100.

View (b) of FIG. 25 illustrates an example of a structure of data stored in one sector. As illustrated in view (b) of FIG. 25B, a portion D1'_1 of compressed data divided into two pieces of compressed data, first parity information ECC1, the remaining portion D1'_2 of the compressed data divided into the two pieces of compressed data, padding information PAD, and second parity information ECC2 may be sequentially stored in each sector.

View (c) of FIG. 25 illustrates another example of a structure of data stored in one sector. As illustrated in FIG. 25C, the portion D1'_1 of the compressed data divided into the two pieces of compressed data, the remaining portion D1'_2 of the compressed data divided into the two pieces of compressed data, the padding information PAD, the first parity information ECC1, and the second parity information ECC2 may be sequentially stored in each sector.

View (d) of FIG. 25 illustrates another example of a structure of data stored in one sector. As illustrated in view (d) of FIG. 25, the portion D1'_1 of the compressed data divided into the two pieces of compressed data, the remaining portion D1'_2 of the compressed data divided into the two pieces of compressed data, the first parity information ECC1, the padding information PAD, and the second parity information ECC2 may be sequentially stored in each sector.

Figure 26:
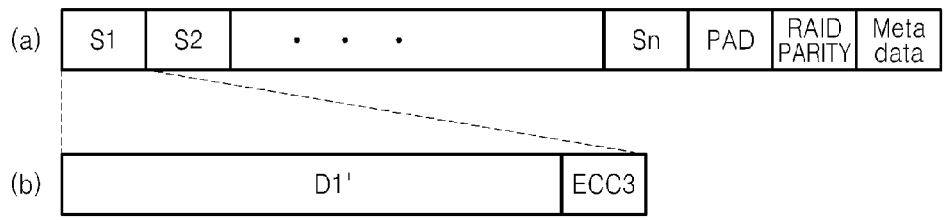
FIG. 26 illustrates an example of a structure of data stored in one page of a memory device in the method of performing a write operation in a memory system, according to another exemplary embodiment of the present general inventive concept.

When operation S120B of generating a plurality of types of ECC information according to another embodiment of the inventive concept, as illustrated in FIG. 12, is applied, an example of a structure of data stored in one page of the memory device 1200 is illustrated in views (a) and (b) of FIG. 26.

View (a) of FIG. 26 illustrates an example of a structure of data stored in one page.

As illustrated in view (a) of FIG. 26, a plurality of pieces of sector data S1 to Sn and metadata may be stored in one page. For example, a sector size may be set to be identical to the ECC encoding processing size of the memory controller 1100.

View (b) of FIG. 26 illustrates an example of a structure of data stored in one sector. As illustrated in view (b) of FIG. 26, compressed data D1' and third information ECC3 for each sector may be stored in each sector. Referring to view (b) of FIG. 26, the compressed data D1' and ECC information (the third information ECC3) are stored in each sector without filling a spare storage area according to data compression with padding information. Since the padding information is not written in the spare storage area according to data compression, a sector data storage space is reduced. RAID information is stored in the storage area secured through compression of sector data as described above.

Figure 14:
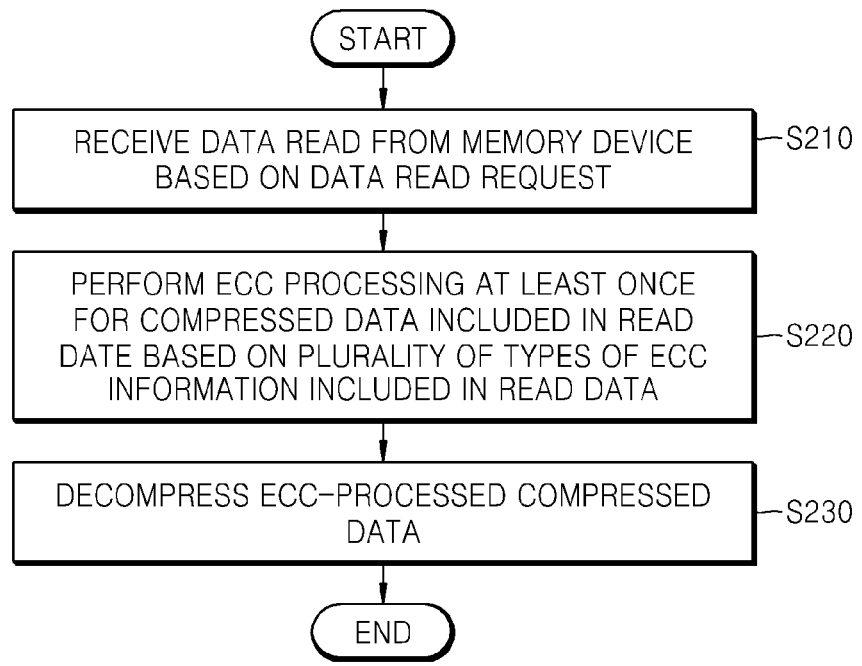
FIG. 14 is a flowchart illustrating a method of performing a read operation in a memory system, according to an exemplary embodiment of the present general inventive concept.

FIG. 14 is a flowchart illustrating a method of performing a read operation in a memory system, according to an exemplary embodiment of the present general inventive concept.

In operation S210, the CPU 1120 controls the memory controller 1100 to receive data read from the memory device 1200 in the read operation. For example, the memory controller 1100 may receive data read from memory cells connected to a word line of the memory device 1200, which corresponds to a read-requested page. As an example, the memory controller 1100 may receive read data of a page unit as illustrated in view (a) of FIG. 27 from the memory device 1200. As another example, the memory controller 1100 may receive read data of a page unit as illustrated in view (a) of FIG. 28 from the memory device 1200.

In operation S220, the CPU 1120 controls the memory system 1000 to perform ECC processing at least once for compressed data included in read data based on a plurality of types of ECC information included in the read data. For example, the CPU 1120 may control the memory system 1000 to perform first ECC processing of the compressed data included in the read data based on a first type of ECC information from among the plurality of types of ECC information included in the read data. In addition, when error correction has failed in the result of the first ECC processing, the CPU 1120 may control the memory system 1000 to perform second ECC processing of the compressed data included in the read data based on a second type of ECC information from among the plurality of types of ECC information.

In operation S230, the CPU 1120 controls the memory system 1000 to decompress the ECC-processed compressed data after performing operation S220. For example, the compressed data ECC-processed by the ECC processing unit 1150 is transmitted to the decompression processing unit 1140. The decompression processing unit 1140 decompresses the compressed data.

Figure 15:
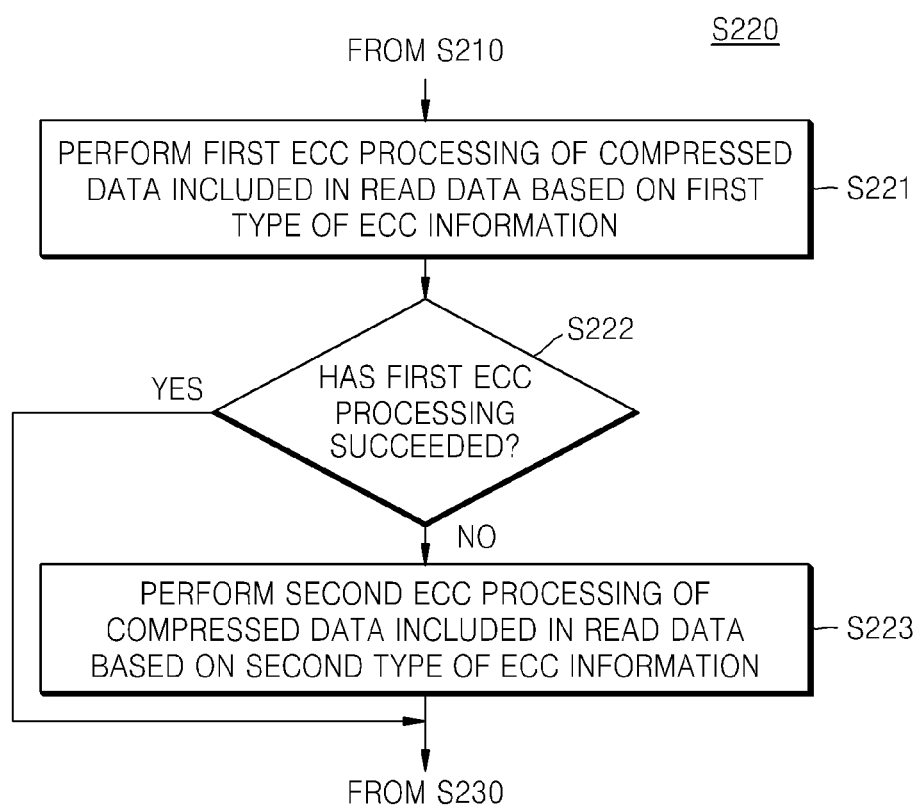
FIG. 15 is a detailed flowchart illustrating a method of performing ECC processing in the method of FIG. 14, according to an exemplary embodiment of the present general inventive concept.

FIG. 15 is a detailed flowchart illustrating operation S220 of performing ECC processing in the method of FIG. 14, according to an exemplary embodiment of the present general inventive concept.

In operation S221, the CPU 1120 controls the memory system 1000 to perform the first ECC processing of the compressed data included in read data based on the first type of ECC information extracted from the read data.

In operation S222, the CPU 1120 determines whether the first ECC processing has succeeded based on the first type of ECC information. In the result of the determination in operation S222, if the first ECC processing has succeeded, the CPU 1120 controls the memory system 1000 to proceed to operation S230.

In the result of the determination in operation S222, if the first ECC processing has failed, in operation S223, the CPU 1120 controls the memory system 1000 to perform the second ECC processing of the compressed data included in read data based on the second type of ECC information extracted from the read data. As an additional example, after reflecting a result of the second ECC processing, the first ECC processing based on the first type of ECC information may be performed again.

Figure 16:
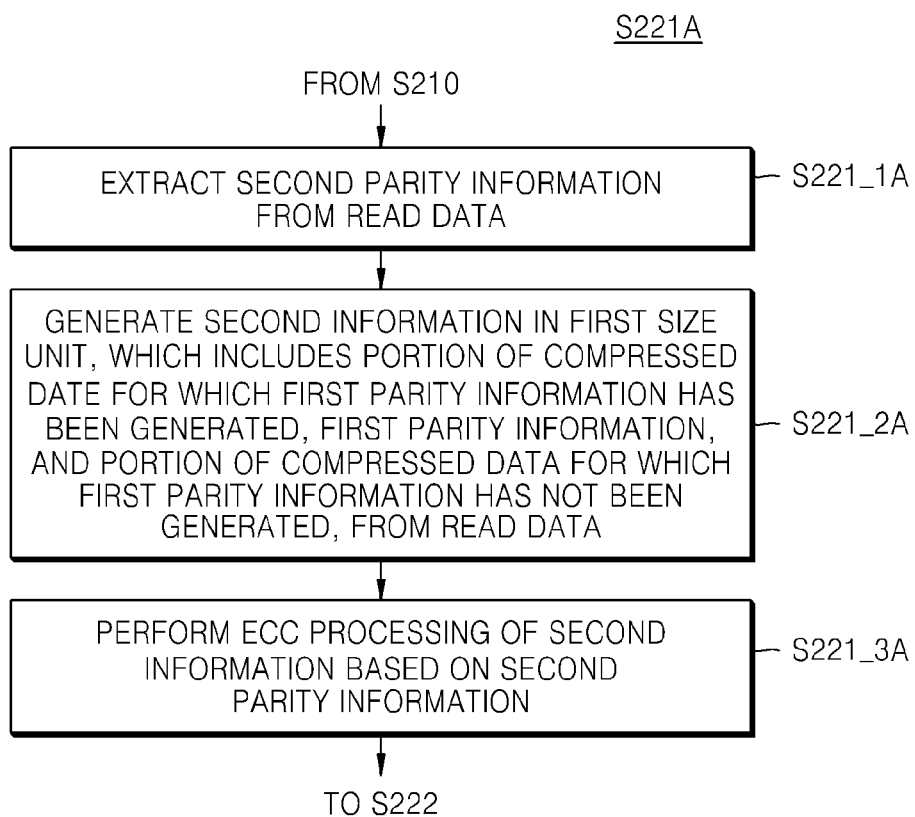
FIG. 16 is a detailed flowchart illustrating a method of performing first ECC processing in the method of FIG. 15, according to an exemplary embodiment of the present general inventive concept.

FIG. 16 is a detailed flowchart illustrating operation S221 (S221A) of performing the first ECC processing in the method of FIG. 15, according to an exemplary embodiment of the present general inventive concept.

Figure 27:
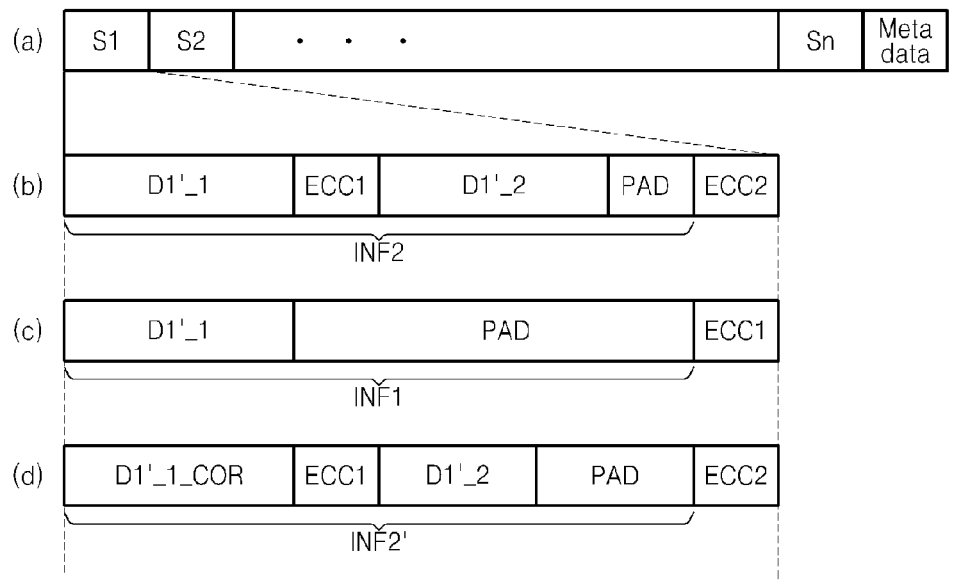
FIG. 27 illustrates conceptual diagrams describing a data processing procedure in the method of performing a read operation in a memory system, according to an exemplary embodiment of the present general inventive concept.

Operation S221A of performing the first ECC processing according to an embodiment of the inventive concept, which is illustrated in FIG. 16, may be performed when read data has the same type as illustrated in view (a) of FIG. 27 is received.

Referring to views (a) through (d) of FIG. 27, view (a) illustrates a structure of read data of one page, which is received from the memory device 1200. As illustrated in view (a) of FIG. 27, the read data of one page includes, for example, a plurality of pieces of sector data S1 through Sn and metadata. For example, each sector data may include a portion D1'_1 of compressed data divided into two pieces of compressed data, first parity information ECC1, the remaining portion D1'_2 of the compressed data divided into the two pieces of compressed data, and second parity information ECC2.

Referring to FIGS. 16 and 27 (views (a) and (b)), in operation S221_1A, the CPU 1120 controls the memory system 1000 to extract the second parity information ECC2 from the read data in a sector unit.

In operation S221_2A, the CPU 1120 controls the memory system 1000 to generate second information INF2 of a first size unit, which includes the portion D1'_1 of the compressed data for which the first parity information ECC1 has been generated, the first parity information ECC1, and the portion D1'_2 of the compressed data for which the first parity information ECC1 has not been generated, from the read data. For example, as illustrated in view (b) of FIG. 27, the second information INF2 in an ECC encoding processing size is generated by adding padding information PAD to (D1'_1+ECC1+D1'_2).

In operation S221_3A, the CPU 1120 controls the memory system 1000 to perform ECC processing of the second information INF2, which is generated in operation S221_2A, based on the second parity information ECC2. For example, the ECC processing unit 1150 may perform the ECC processing of (D1'_1+ECC1+D1'_2+PAD), which is the second information INF2, based on the second parity information ECC2.

Figure 17:
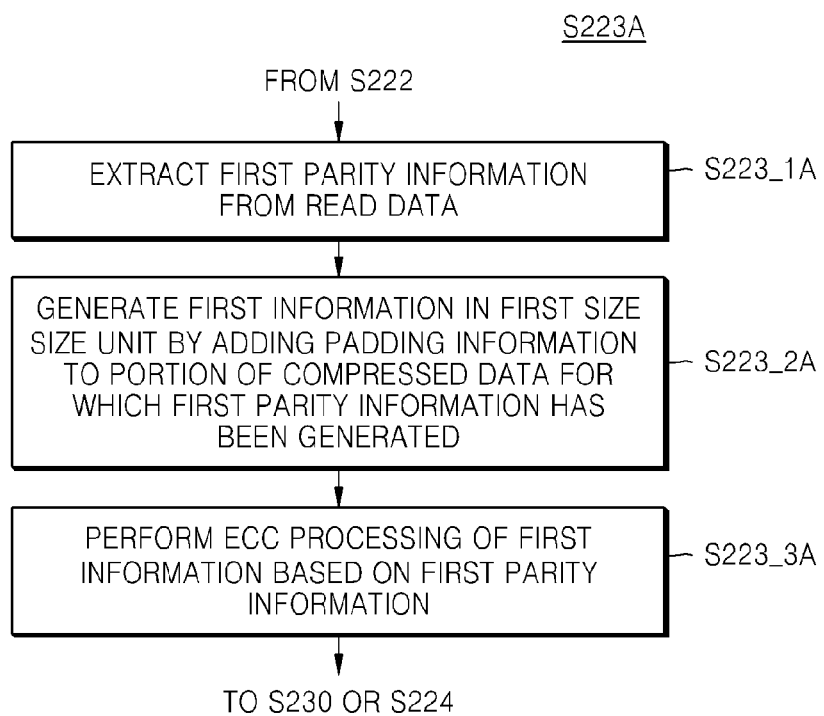
FIG. 17 is a detailed flowchart illustrating a method of performing second ECC processing in the method of FIG. 15, according to an exemplary embodiment of the present general inventive concept.

FIG. 17 is a detailed flowchart illustrating operation S223 (S223A) of performing second ECC processing in the method of FIG. 15, according to an exemplary embodiment of the present general inventive concept.

Operation S223A of performing the second ECC processing according to an embodiment of the inventive concept, which is illustrated in FIG. 17, may be performed when read data has the same type as illustrated in view (a) of FIG. 27 is received.

Referring to FIGS. 17 and 27 (views (a) and (c)), in operation S223_1A, the CPU 1120 controls the memory system 1000 to extract the first parity information ECC1 from the read data of a sector unit.

In operation S223_2A, the CPU 1120 controls the memory system 1000 to generate first information INF1 of the first size unit by adding padding information PAD to the portion D1'_1 of the compressed data for which the first parity information ECC1 has been generated, from the read data. For example, as illustrated in view (c) of FIG. 27, the first information INF1 of an ECC encoding processing size is generated by adding padding information PAD to D1_1.

In operation S223_3A, the CPU 1120 controls the memory system 1000 to perform ECC processing of the first information INF1 based on the first parity information ECC1. For example, the ECC processing unit 1150 may perform the ECC processing of (D1'_1+PAD), which is the first information INF1, based on the first parity information ECC1.

Figure 18:
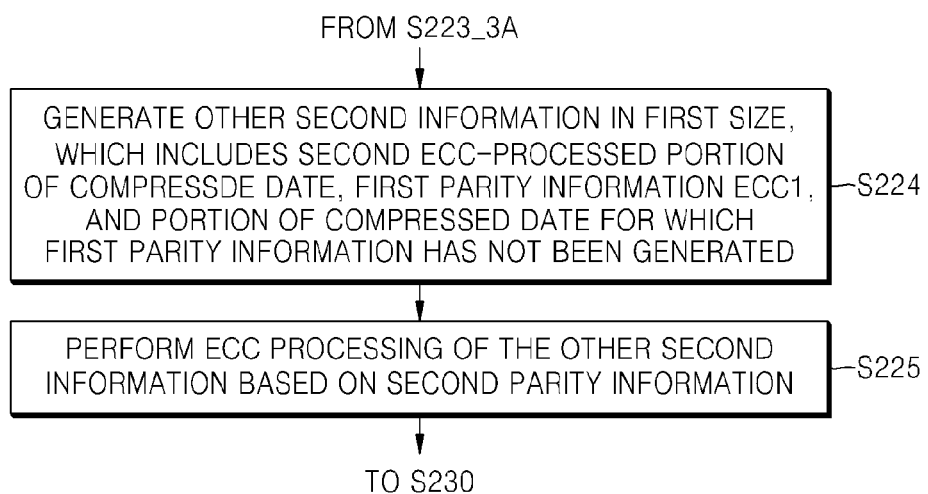
FIG. 18 is a flowchart illustrating a method of performing the first ECC processing again based on a result of the second ECC processing in the method of FIG. 17, according to an exemplary embodiment of the present general inventive concept.

FIG. 18 is a flowchart illustrating a method of performing the first ECC processing again based on a result of the second ECC processing in the method (operation 223A) of FIG. 17, according to an exemplary embodiment of the present general inventive concept.

Referring to FIGS. 18 and 27 (views (a) and (d)), in operation S224, the CPU 1120 generates other second information INF2' in the first size, which includes the second ECC-processed portion D1'_1_COR of the compressed data, the first parity information ECC1, and the portion D1'_2 of the compressed data for which the first parity information ECC1 has not been generated, wherein D1'_1_COR denotes information ECC-processed for D1'_1, which is a portion of the compressed data, in operation S223A of performing the second ECC processing, which is shown in FIG. 17. For example, as illustrated in view (d) of FIG. 27, the other second information INF2' of the ECC encoding processing size may be generated by adding padding information PAD to (D1'_1_COR+ECC1+D1'_2).

In operation S225, the CPU 1120 controls the memory system 1000 to perform ECC processing of the other second information INF2' based on the second parity information ECC2. For example, the ECC processing unit 1150 may perform the ECC processing of (D1'_1_COR+ECC1+D1'_2+PAD), which is the other second information INF2', based on the second parity information ECC2.

Figure 19:
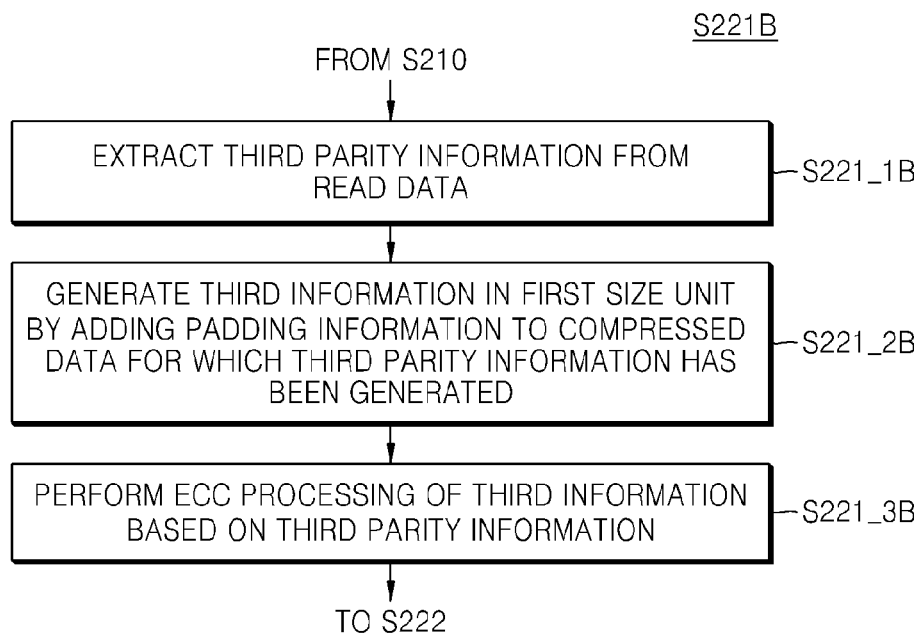
FIG. 19 is a detailed flowchart illustrating a method of performing first ECC processing in the method of FIG. 15, according to another exemplary embodiment of the present general inventive concept.

FIG. 19 is a detailed flowchart illustrating operation S221 (S221B) of performing first ECC processing in the method of FIG. 15, according to another exemplary embodiment of the present general inventive concept.

Figure 28:
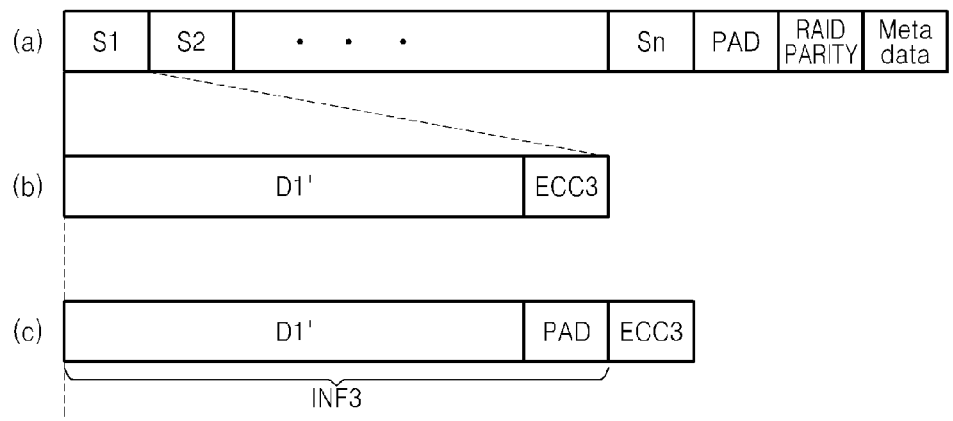
FIG. 28 illustrates conceptual diagrams describing a data processing procedure in the method of performing a read operation in a memory system, according to another exemplary embodiment of the present general inventive concept.

Operation S221B of performing the first ECC processing according to another exemplary embodiment of the present general inventive concept, which is illustrated in FIG. 19, may be performed when read data has the same type as illustrated in view (a) of FIG. 28 is received Referring to views (a) and (b) of FIG. 28, view (a) illustrates a structure of read data of one page, which is received from the memory device 1200. As illustrated in view (a) of FIG. 28, the read data of one page includes, for example, a plurality of pieces of sector data S1 through Sn, padding information PAD, RAID parity information, and metadata. For example, as illustrated in view (b) of FIG. 28, each sector data may include compressed data D1' and third parity information ECC3.

Referring to FIGS. 19 and 28 (views (a) through (c)), in operation S221_1B, the CPU 1120 controls the memory system 1000 to extract the third parity information ECC3 from the read data of a sector unit.

In operation S221_2B, the CPU 1120 generates third information INF3 of a first size unit by adding padding information PAD to the compressed data D1' for which the third parity information ECC3 has been generated, in units of a sector from the read data. For example, as illustrated in view (c) of FIG. 28, the third information INF3 in an ECC encoding processing size may be generated by adding the padding information PAD to the compressed data D1'.

In operation S221_3B, the CPU 1120 controls the memory system 1000 to perform ECC processing of the third information INF3 based on the third parity information ECC3. For example, the ECC processing unit 1150 may perform the ECC processing of (D1'+PAD), which is the third information INF3, based on the third parity information ECC3.

Figure 20:
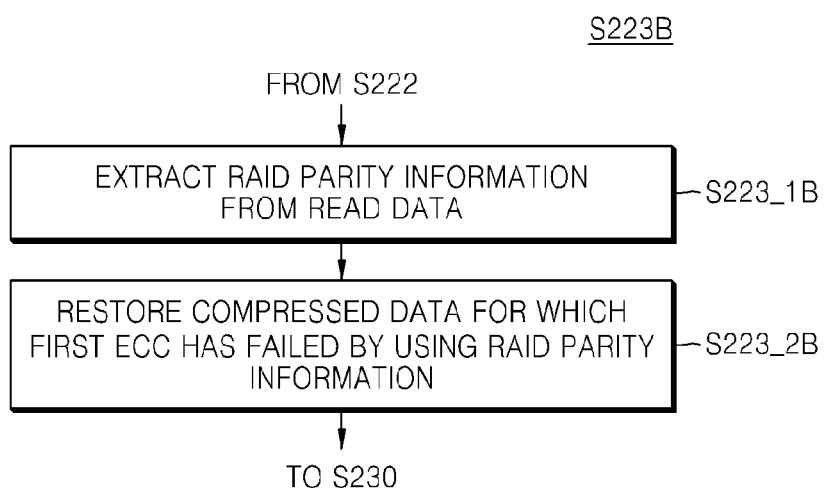
FIG. 20 is a detailed flowchart illustrating a method of performing second ECC processing in the method of FIG. 15, according to another exemplary embodiment of the present general inventive concept.

FIG. 20 is a detailed flowchart illustrating operation S223 (S223B) of performing the second ECC processing in the method of FIG. 15, according to another embodiment of the inventive concept.

Operation S223B of performing the second ECC processing according to another embodiment of the inventive concept, which is illustrated in FIG. 20, may be performed when read data has the same type as illustrated in view (a) of FIG. 28 is received Referring to FIGS. 20 and 28 (view (a)), in operation S223_1B, the CPU 1120 controls the memory system 1000 to extract the RAID parity information from the read data in page units. For example, as illustrated in view (a) of FIG. 28, the RAID parity information may be extracted from the read data in the page units.

In operation S223_2B, the CPU 1120 controls the memory system 1000 to restore compressed data for which first ECC has failed by using the RAID parity information. For example, referring to view (a) of FIG. 28, one piece of sector data for which ECC processing has failed from among the plurality of pieces of sector data 51 through Sn forming one page may be restored by using the RAID parity information. For example, when ECC processing of sector data S2 has failed, the ECC processing unit 1150 may restore the sector data S2 by using the RAID parity information and the remaining pieces of sector data 51 and S3 through Sn except for the sector data S2 for which ECC processing has failed.

For example, the ECC processing unit 1150 may restore the sector data S2 by XOR-operating corresponding bit values of the sector data 51 and S3 to Sn and the RAID parity information.

Figure 29:
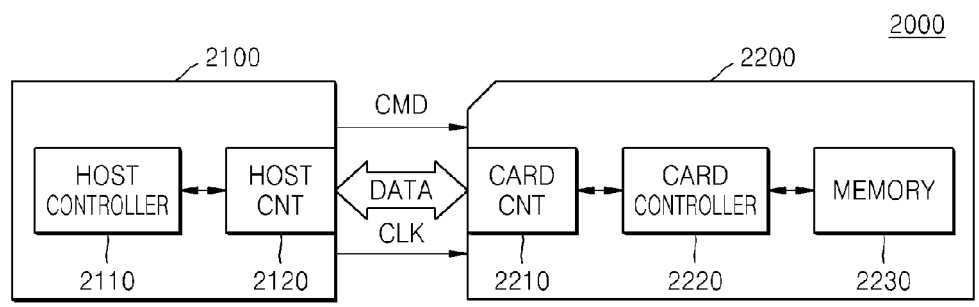
FIG. 29 is a block diagram of an example in which a memory system according to the exemplary embodiments of the present general inventive concept is applied to a memory card.

FIG. 29 is a block diagram of an example in which the memory system 100 or 1000 according to exemplary embodiments of the present general inventive concept is applied to a memory card 2200.

Referring to FIG. 29, a memory card system 2000 may include a host 2100 and the memory card 2200. The host 2100 may include a host controller 2110 and a host connection unit 2120. The memory card 2200 may include a card connection unit 2210, a card controller 2220, and a memory device 2230.

The host 2100 may write data into the memory card 2200 or read data stored in the memory card 2200. The host controller 2110 may transmit a command CMD, a clock signal CLK generated by a clock generator (not illustrated) in the host 2100, and data DATA to the memory card 2200 via the host connection unit 2120.

In response to the command CMD received via the card connection unit 2210, the card controller 2220 may store the data DATA in the memory device 2230 in synchronization with a clock signal generated by a clock generator (not illustrated) in the card controller 2220. The memory device 2230 may store the data DATA received from the host 2100. In this case, the card controller 2220 may be implemented by the memory controller 10 or 1100 illustrated in FIG. 1 or 7.

The memory card 2200 may be implemented by a compact flash card (CFC), a microdrive, a smart media card (SMC) a multimedia card (MMC), a security digital card (SDC), a memory stick, a universal serial bus (USB) flash memory drive, etc., but is not limited thereto.

Figure 30:
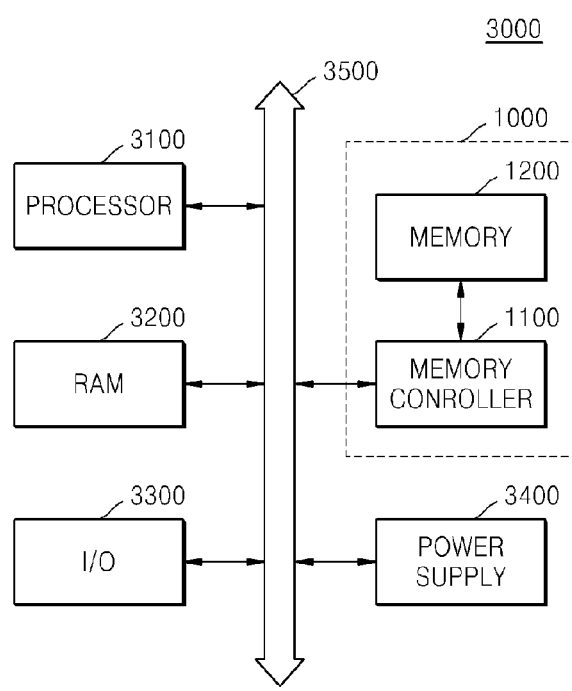
FIG. 30 is a block diagram of a computing system including a memory system according to the exemplary embodiment of the present general inventive concept.

FIG. 30 is a block diagram of a computing system 3000 including the memory system 1000 according to exemplary embodiments of the present general inventive concept.

Referring to FIG. 30, the computing system 3000 may include a processor 3100, a RAM 3200, an input/output (I/O) device 3300, a power supply 3400, and the memory system 1000. Although not illustrated in FIG. 30, the computing system 3000 may further include ports to perform communication with a video card, a sound card, a memory card, a USB device, or other electronic devices. The computing system 3000 may be implemented by a personal computer (PC) or a portable electronic device, such as a laptop computer, a mobile phone, a personal digital assistant (PDA), a camera, etc., but is not limited thereto.

The processor 3100 may execute predetermined calculations or tasks. According to an exemplary embodiment of the present general inventive concept, the processor 3100 may be a microprocessor or a CPU. The processor 3100 may communicate with the RAM 3200, the I/O device 3300, and the memory system 1000 via a bus 3500, such as an address bus, a control bus, a data bus, and so forth. According to an exemplary embodiment of the present general inventive concept, the processor 3100 may also be connected to an extension bus, such as a Peripheral Component Interconnect (PCI) bus.

The RAM 3200 may store data required to operate the computing system 3000. For example, the RAM 3200 may be implemented by a DRAM, a mobile DRAM, an SRAM, a PRAM, an FRAM, an RRAM, and/or an MRAM.

The I/O device 3300 may include an input unit, such as a keyboard, a keypad, a mouse, and an output unit, such as a printer and a display. The power supply 3400 may supply an operating voltage required to operate the computing system 3000.

Figure 31:
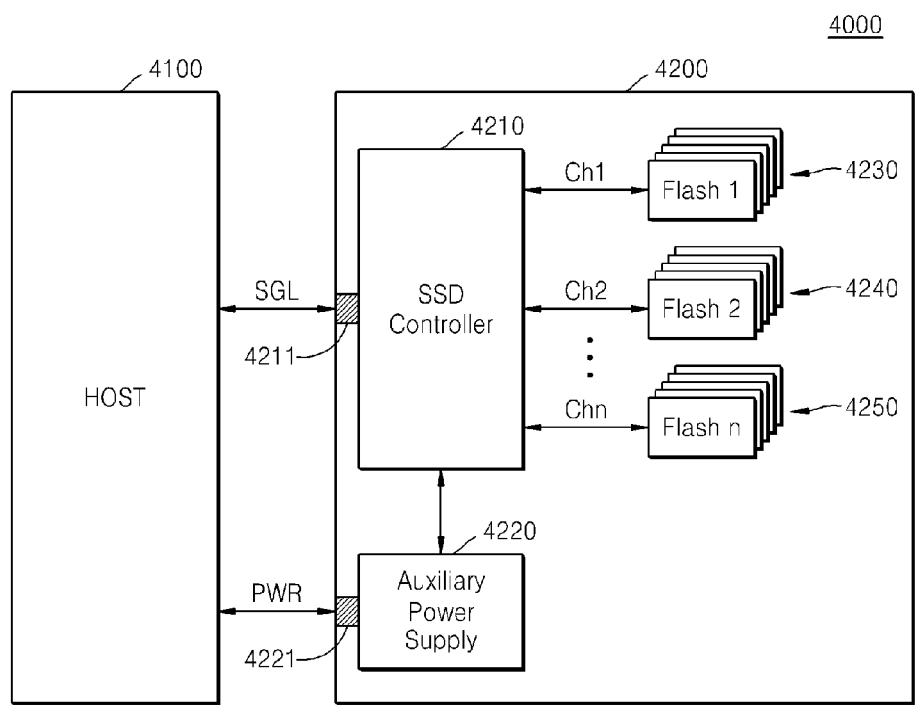
FIG. 31 is a block diagram of an example in which a memory system according to the exemplary embodiment of the present general inventive concept is applied to a solid state drive (SSD)

FIG. 31 is a block diagram of an example in which the memory system 100 or 1000 according to the exemplary embodiments of the present general inventive concept is applied to an SSD 4200.

Referring to FIG. 31, an SSD system 4000 may include a host 4100 and the SSD 4200. The SSD 4200 exchanges signals with the host 4100 via a signal connector 4211 and receives power via a power connector 4221. The SSD 4200 may include an SSD controller 4210, an auxiliary power supply 4220, and a plurality of memory devices 4230, 4240, and 4250. The SSD controller 4210 may be implemented by the memory controller 10 or 1100 illustrated in FIG. 1 or 7.

Figure 32:
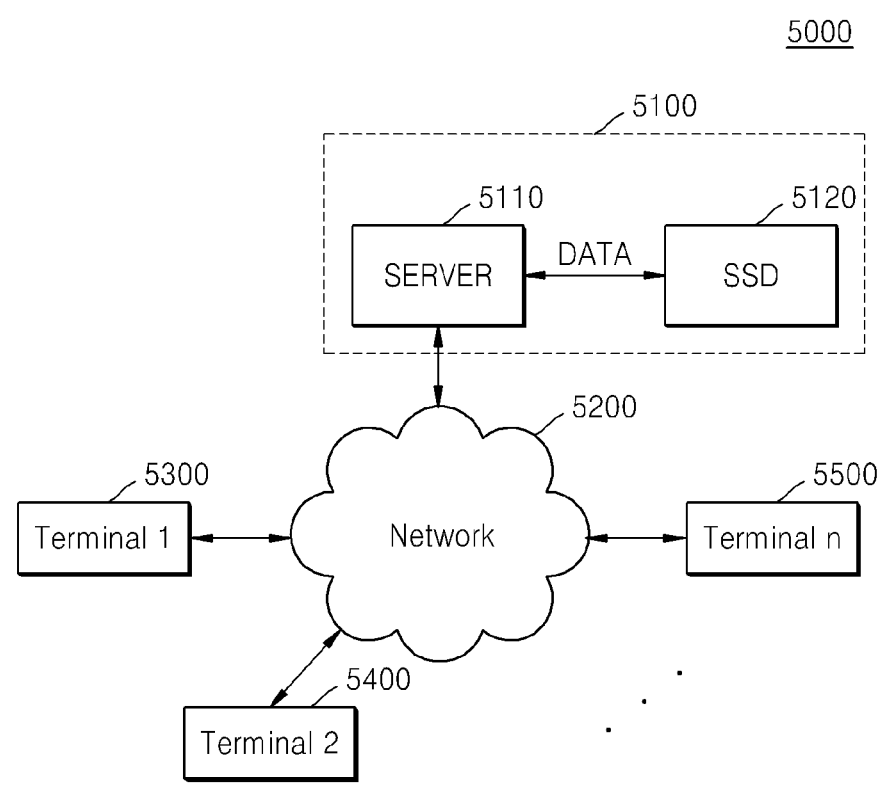
FIG. 32 is a block diagram of a server system including the SSD of FIG. 31 and a network system, according to an exemplary embodiment of the present general inventive concept.

FIG. 32 is a block diagram of a network system 5000 according to an exemplary embodiment of the present general inventive concept.

Referring to FIG. 32, the network system 5000 may include the server system 5100 and a plurality of terminals 5300, 5400, and 5500, which are connected to one other over a network 5200. The server system 5100 may include a server 5110 to process requests received from the plurality of terminals 5300, 5400, and 5500 connected over the network 5200 and the SSD 5120 to store data corresponding to the requests received from the plurality of terminals 5300, 5400, and 5500. The SSD 5120 may be the SSD 4200 illustrated in FIG. 31.

A flash memory system according to an embodiment of the inventive concept as described above may be embedded using various forms of packages. For example, a memory system according to an embodiment of the inventive concept may be embedded using packages, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and so forth.

While the present general inventive concept has been particularly shown and described with reference to exemplary embodiments thereof, it will be understood that various changes in form and details may be made therein without departing from the spirit and scope of the following claims.

What is claimed is:

1. A method of performing a write operation in a memory system, comprising:
   compressing data of a first size unit to generate compressed data;
   generating a plurality of types of Error Checking and Correction (ECC) information based on the compressed data;
   combining the compressed data and the plurality of types of ECC information to generate combined information in units of a second size; and
   writing the combined information in units of the second size into a memory device,
   wherein the generating of the plurality of types of the ECC information comprises:
   dividing the compressed data into a plurality of pieces;
   generating a first type of the ECC information based on a first piece of the compressed data; and
   generating a second type of the ECC information based on the first piece of the compressed data, the first type of the ECC information, and a second piece of the compressed data.

2. The method of claim 1, wherein the first size unit is determined as an ECC encoding processing size unit in the memory system.

3. The method of claim 1, wherein the generating of the plurality of types of ECC information comprises:
   generating first parity information by firstly performing ECC encoding processing of the first piece of divided compressed data; and
   generating second parity information by secondly performing ECC encoding processing of information, which includes the first piece of the divided compressed data for which the first parity information has been generated, the first parity information, and the second piece of the divided compressed data for which the first parity information has not been generated.

4. The method of claim 3, wherein the generating of the first parity information comprises:
   generating first information of the first size unit by adding initially set padding information to the portion of the plurality of pieces of divided compressed data; and
   generating the first parity information by performing ECC encoding processing of the first information.

5. The method of claim 3, wherein the generating of the second parity information comprises:
   generating second information of the first size unit by adding initially set padding information to the information, which includes the first piece of the plurality of pieces of divided compressed data for which the first parity information has been generated, the first parity information, and second piece of the plurality of pieces of divided compressed data for which the first parity information has not been generated; and
   generating the second parity information by performing ECC encoding processing of the second information.

6. The method of claim 1, wherein the generating of the plurality of types of ECC information comprises:
   generating third information of the first size unit by adding initially set padding information to the compressed data;
   generating third parity information by performing ECC encoding processing of the third information; and
   generating RAID parity information for a plurality of pieces of information of the first size unit for which the third parity information has been generated,
   wherein the RAID parity information is generated to be able to restore one piece of information of the first size unit for which error correction is unable to be done from among the plurality of pieces of information of the first size unit.

7. The method of claim 1, wherein the combining in units of the second size comprises generating information of the second size unit by combining the compressed data and the plurality of types of ECC information and adding initially set padding information to the combined information.

8. The method of claim 1, further comprising generating metadata including attribute information for the information combined in units of the second size,
   wherein the attribute information includes information used to generate the plurality of types of ECC information or padding size information used to generate information in units of the first or second size.

9. A method of performing a read operation in a memory system, comprising:
   receiving data read from a memory device as read data based on a data reading request;
   performing at least one type of Error Checking and Correction (ECC) processing of compressed data included in the read data based on a plurality of types of ECC information included in the read data; and
   decompressing the compressed data for which the ECC processing has been performed,
   wherein the plurality of types of the ECC information comprises:
   a first type of the ECC information generated based on a first piece of the compressed data divided from the compressed data; and
   a second type of the ECC information generated based on the first piece of the compressed data, the first type of the ECC information, and a second piece of the compressed data divided from the compressed data.

10. The method of claim 9, wherein the performing of the ECC processing comprises:
    performing first ECC processing of the compressed data included in the read data based on the first type of ECC information from among the plurality of types of ECC information included in the read data; and
    performing second ECC processing of the compressed data included in the read data based on the second type of ECC information from among the plurality of types of ECC information if error correction has failed in the performing of the first ECC processing.

11. The method of claim 10, wherein the performing of the first ECC processing comprises:
    extracting second parity information from the read data;
    generating second information in first size unit, which includes compressed data of a portion of the read data for which first parity information has been generated, the first parity information, and compressed data of another portion of the read data for which the first parity information has not been generated; and performing the ECC processing of the second information based on the second parity information.

12. The method of claim 10, wherein the performing of the second ECC processing comprises:

extracting first parity information from the read data if the error correction has failed in the result of the first ECC processing;

generating first information in a first size by adding initially set padding information to compressed data of a portion of the read data for which first parity information has been generated; and performing another ECC processing of the first information based on the first parity information.

13. The method of claim 12, further comprising:

generating other second information of the first size unit, which includes compressed data of a portion of the read data for which the second ECC processing has been performed, the first parity information, and the compressed data of the portion of the read data for which first parity information has been generated; and performing ECC processing of the other second information based on the second parity information extracted from the read data.

14. The method of claim 10, wherein the performing of the first ECC processing comprises:

extracting third parity information from the read data;

generating third information of the first size by extracting another compressed data for which the third parity information has been generated and adding initially set padding information to the compressed data; and performing ECC processing of the third information based on the third parity information.

15. The method of claim 10, wherein the performing of the second ECC processing comprises restoring the compressed data for which error correction has failed in the result of the second ECC processing, by using RAID parity information included in the read data.

16. A memory system to receive data from a host, comprising:

a memory controller, comprising:

a compression processing unit to compress the data received from the host and to output compressed data of a first size unit, an error checking and correction (ECC) processing unit to generate a plurality of types of ECC information based on the compressed data, a central processing unit (CPU) to combine the compressed data and the plurality of types of ECC information to generate combined information in units of a second size; and a memory device to receive the combined information in the second size unit from the CPU, wherein the ECC processing unit divides the compressed data into a plurality of pieces, generates a first type of the ECC information based on a first piece of the compressed data, and generates a second type of the ECC information based on the first piece of the compressed data, the first type of the ECC information, and a second piece of the compressed data.

17. The memory system of claim 16, wherein the data received from the host includes at least one of an application program file, user data, and metadata.

18. The memory system of claim 16, wherein the memory controller further comprises:

a decompression processing unit to receive the compressed data from the memory device and to decompress the compressed data.

19. The memory system of claim 16, wherein the memory controller further comprises:

a memory interface to exchange a command, an address, and another data with the memory device under the control of the CPU.

20. The memory system of claim 16, wherein the memory controller further comprises:

a host interface to exchange another data with the host connected to the memory system and to mutually connect the memory system and the host.

* * * * *